US009171736B2

(12) United States Patent
Raley et al.

(10) Patent No.: US 9,171,736 B2
(45) Date of Patent: Oct. 27, 2015

(54) SPACER MATERIAL MODIFICATION TO IMPROVE K-VALUE AND ETCH PROPERTIES

(71) Applicant: Tokyo Electron Limited, Minato-ku, Tokyo (JP)

(72) Inventors: Angelique D. Raley, Mechanicville, NY (US); David L. O'Meara, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/195,099

(22) Filed: Mar. 3, 2014

(65) Prior Publication Data

US 2015/0249017 A1    Sep. 3, 2015

(51) Int. Cl.
| | |
|---|---|
| *H01L 21/336* | (2006.01) |
| *H01L 21/311* | (2006.01) |
| *H01L 21/02* | (2006.01) |
| *H01L 29/66* | (2006.01) |

(52) U.S. Cl.
CPC ...... *H01L 21/31111* (2013.01); *H01L 21/0223* (2013.01); *H01L 21/02247* (2013.01); *H01L 21/31116* (2013.01); *H01L 29/6653* (2013.01); *H01L 21/02252* (2013.01)

(58) Field of Classification Search
CPC ...................................................... H01L 29/78

USPC ............................................................... 438/283
See application file for complete search history.

(56) References Cited

U.S. PATENT DOCUMENTS

| 8,592,327 B2 | 11/2013 | Ranjan et al. |
| 2013/0164940 A1 | 6/2013 | Raley et al. |
| 2013/0237060 A1 | 9/2013 | Ranjan et al. |
| 2013/0252430 A1 | 9/2013 | Ranjan et al. |

OTHER PUBLICATIONS

D.W. Hess, "Plasma-assisted oxidation, anodization, and nitridation of silicon," IBM Journal of Research and Development, Plasma Processing, vol. 43, Nos. 1/2, 1999.
A.J. Choksi, et al., "Growth kinectics of silicon dioxide on silicon in an inductively coupled rf plasma at constant anodization currents," J. Appl. Phys. 72 (4), Aug. 15, 1992.

*Primary Examiner* — Anthony Ho

(57) ABSTRACT

A method for performing a spacer etch process is described. The method includes conformally applying a spacer material over a gate structure on a substrate, and performing a spacer etch process sequence to partially remove the spacer material from a capping region of the gate structure and a substrate region on the substrate adjacent a base of the gate structure, while retaining a spacer sidewall positioned along a sidewall of the gate structure. The K-value of high-K spacer materials are reduced to an acceptable range with oxidation using an oxygen plasma treatment. The etch rate of low-K spacer materials are reduced to a target range using a nitrogen plasma treatment. Integration of the spacer etch processing is selected based on impact to the other structures in the substrate.

17 Claims, 25 Drawing Sheets

US 9,171,736 B2

SPACER MATERIAL MODIFICATION TO IMPROVE K-VALUE AND ETCH PROPERTIES

BACKGROUND OF THE INVENTION

1. Field of Invention

The invention relates to a method of preparing a sidewall spacer for a transistor gate on a substrate.

2. Description of Related Art

In semiconductor manufacturing and during the fabrication of a transistor gate, a spacer material is conformally applied to the transistor gate, and then partially removed to form a sidewall spacer on a sidewall of the transistor gate. During the partial removal of the spacer material from the transistor gate top and the substrate, the success of a spacer etch process is determined by measuring, among other things, the following performance metrics: (a) the size of the sidewall spacer footing, (b) the depth of the substrate recess, (c) the amount of sidewall spacer critical dimension (CD) slimming, and (d) the depth of the spacer top recess. Conventional spacer etch processes produce unacceptable results in at least one of these performance metrics.

In addition, as the device nodes are shrinking, parasitic capacitances between the gate and the episilicon facets and between the gates and the contacts are causing device degradations and can no longer be ignored. To minimize these parasitic capacitances, one can lower the K-value of the gate spacer. Conventional spacers materials in use are typically atomic layer deposited silicon nitride and have a K-value around 7 to 7.5. New spacer material candidates have emerged to remedy this issue such as SiBCN or SiOCN. These films although presenting lower K advantages bring integration concerns as their dry etch and wet etch properties may differ from that of conventional spacer material. There is a need to identify the key spacer etch variables and determine the critical ranges for these key spacer etch variables. Furthermore, there is a need for methods and systems that can address the need to reduce the K-value of spacers and also resolve the integration issues in etch properties of the resulting spacers when new low-k materials are considered. The benefits and impact of the steps in the integration flow must be evaluated in order to assess the places where spacer processing can be implemented without adversely affecting the other structures in the substrate.

SUMMARY OF THE INVENTION

Embodiments of the invention relate to a method of preparing a sidewall spacer and, in particular, to a method of preparing a sidewall spacer for a transistor gate on a substrate. According to one embodiment, a method for performing a spacer etch process is described. The method includes conformally applying a spacer material over a gate structure on a substrate, and performing a spacer etch process sequence to partially remove the spacer material from a capping region of the gate structure and a substrate region on the substrate adjacent a base of the gate structure, while retaining a spacer sidewall positioned along a sidewall of the gate structure. One or more spacer etch process sequence may include oxidizing an exposed surface of the spacer material to form a spacer oxidation layer, performing a first etching process to anisotropically remove the spacer oxidation layer from the spacer material at the substrate region on the substrate and the spacer material at the capping region of the gate structure, and performing a second etching process to selectively remove the spacer material from substrate region on the substrate and the capping region of the gate structure to leave behind the spacer sidewall on the sidewall of the gate structure.

DETAILED DESCRIPTION OF SEVERAL EMBODIMENTS

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

Figure 1A:
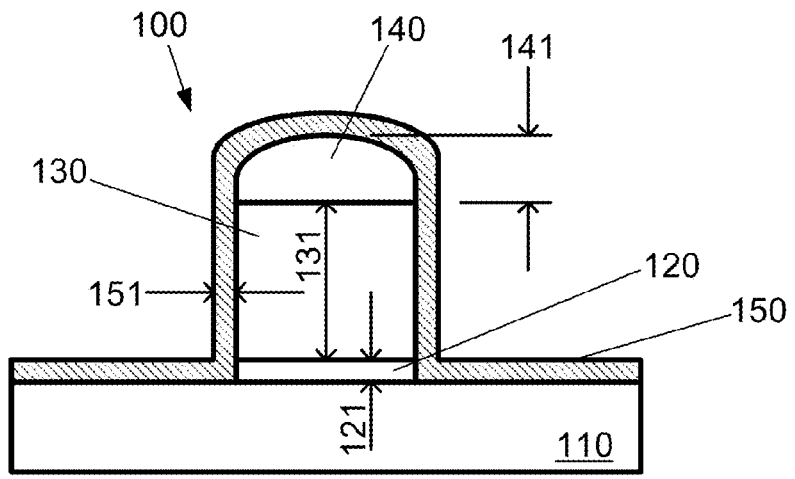
FIGS. 1A through 1C illustrate a schematic representation of the preparation of a sidewall spacer for a gate structure on a substrate.

As noted above in semiconductor manufacturing, when fabricating a transistor gate, a spacer material is conformally applied to the transistor gate, and then partially removed to form a sidewall spacer on a sidewall of the transistor gate. For example, FIG. 1A provides a pictorial illustration of a gate structure 100 formed on substrate 110, wherein the gate structure 100 includes a gate dielectric 120, a gate electrode 130, and a gate capping layer 140. Therein, the gate dielectric 120 may be characterized by an initial gate dielectric thickness 121 (e.g., about 10-40 nm (nanometers)), and the gate electrode 130 may be characterized by an initial gate electrode thickness 131 (e.g., about 30-150 nm). Further, the gate capping layer 140 may be characterized by an initial gate capping layer thickness 141 (e.g., about 10-80 nm).

Use of the term conventional or high-K spacer material or any reference to silicon nitride as a spacer material unless qualified includes silicon nitride ($Si_xN_y$), silicon carbide ($Si_xC_y$), or silicon carbonitride ($Si_xC_yN_z$); and silicon oxycarbonnitride ($Si_xOC_yN_z$). A spacer material layer 150, characterized by an initial spacer material layer critical dimension (CD) 151, is subsequently formed over the gate structure 100. The spacer material layer 150 may be applied via a vapor deposition process to conform to the topography of the gate structure 100, as illustrated in FIG. 1A. For example, the spacer material layer 150 may be deposited using a chemical vapor deposition (CVD) process, a plasma-enhanced CVD (PECVD) process, an atomic layer deposition (ALD) process, a plasma-enhanced ALD (PEALD) process, a physical vapor deposition (PVD) process, a sputtering process, etc. The initial spacer material layer CD 151 may range from about 2 nm (nanometers) to about 20 nm, or preferably from about 5 nm to about 15 nm, or more preferably from about 8 nm to about 12 nm (e.g., about 9-10 nm).

During the partial removal of the spacer material layer 150 from the transistor gate 100 and the substrate 110 to create a sidewall spacer (150A, 150B), the spacer etch process is evaluated by measuring, among other things, the following performance metrics: (a) the amount of CD reduction or slimming of the spacer material layer 150 along the sidewall of the gate structure 100, (b) the existence and/or size of a sidewall spacer footing, (c) the amount of substrate recess exhibited in an exposed surface of the substrate, (d) the amount of spacer recess exhibited in the spacer material layer 150 proximate the top of the gate structure 100, and (e) the amount of capping material consumed from the top surface of the gate capping layer 140.

Figure 1B:
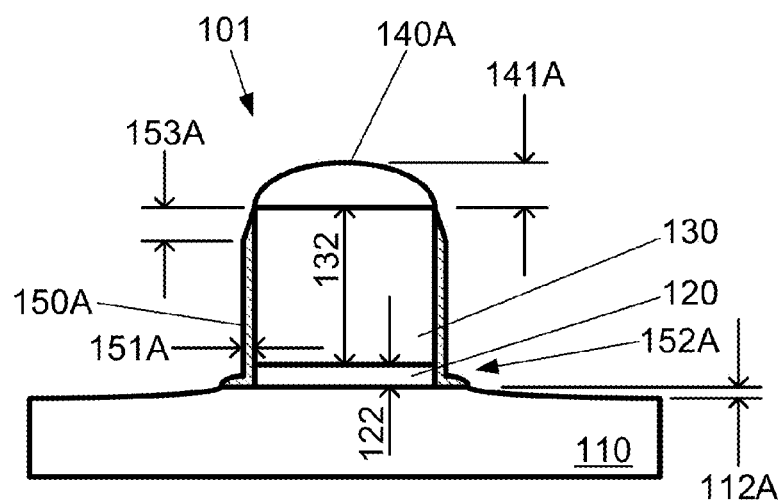

As illustrated in FIG. 1B, conventional spacer etch processes may produce unacceptable results in at least one of these performance metrics. For example, following a conventional spacer etch process, a gate structure 101 is produced having a sidewall spacer 150A characterized by a final spacer material layer CD 151A. The difference between the final spacer material CD 151A and the initial spacer material CD 151 is a measure of the amount of CD reduction or slimming of the spacer material layer 150.

Additionally, for example, gate structure 101 may exhibit a sidewall spacer footing 152A. Furthermore, for example, gate structure 101 may exhibit any one of the following: (i) a substrate recess formed in an exposed surface of substrate 110 and characterized by a substrate recess depth 112A that may exceed 1 nm, 2 nm, and even 5 nm; (ii) a spacer recess in the spacer material layer 150 proximate the top of the gate structure 101 and characterized by a spacer recess depth 153A that may exceed 1 nm, 2 nm, and even 5 nm; and (iii) amount of capping material consumed from the top surface of the gate capping layer 140A and characterized by the difference between a final gate capping layer thickness 141A and the initial gate capping layer thickness 141 that may exceed 5 nm.

Figure 1C:
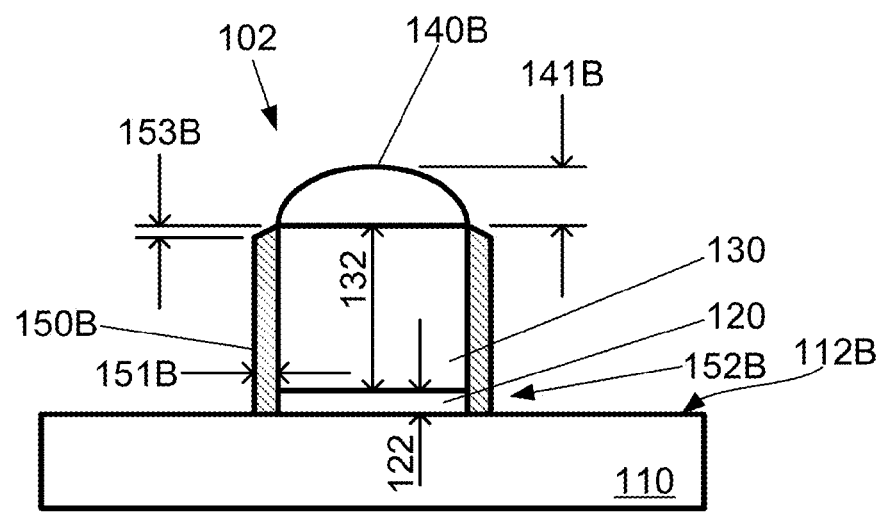

As illustrated in FIG. 1C and further described below, a spacer etch process is presented that produces acceptable results in at least one of these performance metrics. For example, following the spacer etch process, a gate structure 102 is produced having a sidewall spacer 150B characterized by a final spacer material layer CD 151B. The difference between the final spacer material CD 151B and the initial spacer material CD 151 is a measure of the amount of CD reduction or slimming of the spacer material layer 150. The amount of CD reduction or slimming may be reduced to less than 2 nm, and desirably less than 1 nm. Alternatively, the amount of CD reduction or slimming may be reduced to less than 20%, and desirably less than 10% of the initial spacer material CD 151.

Additionally, for example, gate structure 102 may exhibit a reduced or substantially no sidewall spacer footing 152B.

Furthermore, for example, gate structure 102 may exhibit any one of the following: (i) a reduced substrate recess formed in an exposed surface of substrate 110 and characterized by a substrate recess depth 112B that may be less than 3 nm, 2 nm, and even 1 nm; (ii) a spacer recess in the spacer material layer 150 proximate the top of the gate structure 102 and characterized by a spacer recess depth 153B that may be less than 5 nm, 2 nm, and even 1 nm; and (iii) amount of capping material consumed from the top surface of the gate capping layer 140 that produces a final gate capping layer 140B characterized by the difference between a final gate capping layer thickness 141B and the initial gate capping layer thickness 141 that may be less than 5 nm.

The inventors found out that there are several approaches to resolving the need to reduce the K-value of spacers and also resolve impact of changes in etch properties of the resulting spacers when new low-k materials are considered. The benefits and impact of where in the integration flow the spacer processing is done were evaluated in order to assess the places where spacer processing can be implemented without adversely affecting the other structures in the substrate. The first approach uses conventional materials for a spacer film with plasma oxidation to create a modified layer of silicon dioxide to reduce the overall K-value of the spacer. Within this approach, several points in the integration flow can be used where the spacer film processing can be implemented with minimal adverse effects to the remaining structures in the substrate. The second approach is to treat low-K spacer films such as SiBCN, SiON, and SiBCN with plasma oxidation to lower the overall K-value of the spacer. Similarly, several points in the integration flow were identified where the spacer film processing can be implemented with minimal adverse effects to the remaining structures in the substrate. The third approach is to treat low-K spacer films such as SiBCN, SiON, and SiBCN with plasma nitridation step to increase wet etch rate resistance to treatment liquids, for example dilute hydrochloric acid (DHF), or buffered hydrochloric acid (BHF). As above, several points in the integration flow were identified where the spacer film processing can be implemented with minimal adverse effects to the remaining structures in the substrate.

Figure 15A:
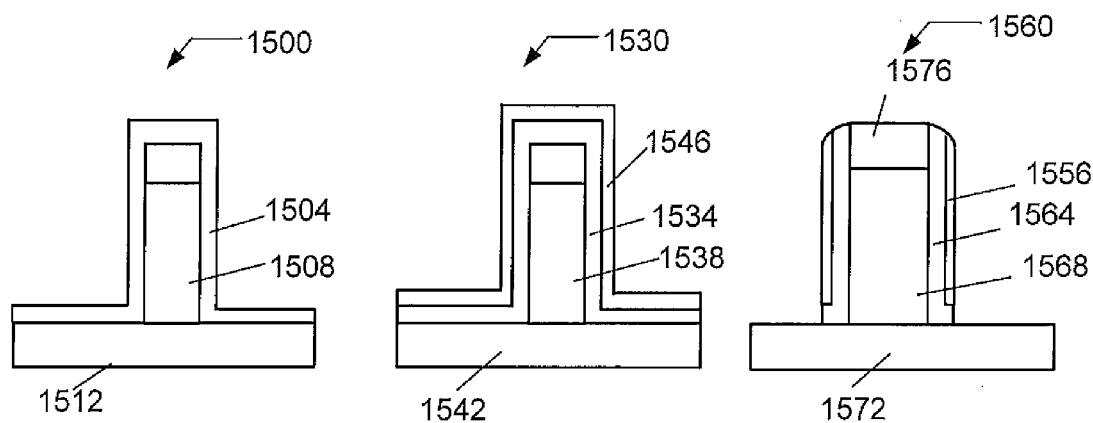
FIG. 15A depicts a schematic representation of a method for performing a spacer etch process according to an embodiment utilizing a post deposition treatment and oxidation.
Figure 16A:
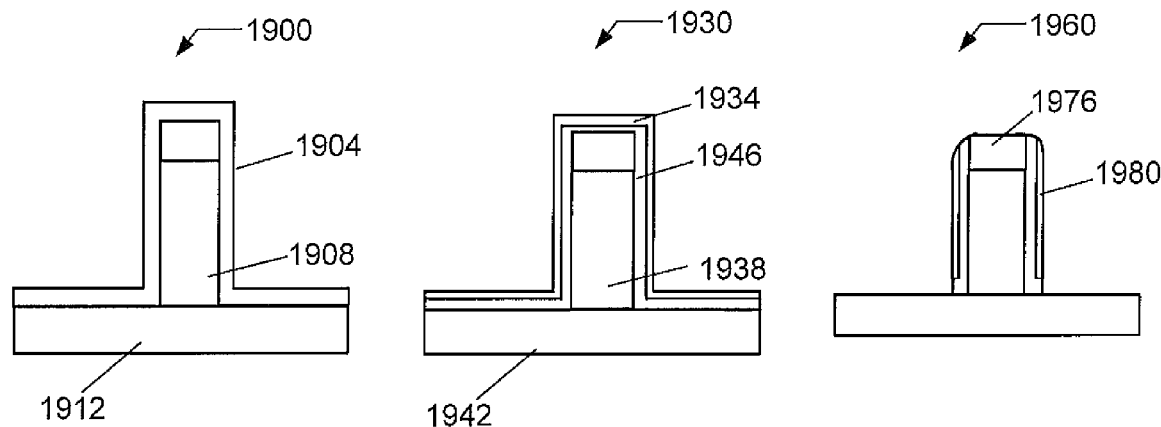
FIG. 16A depicts a schematic representation of a method for performing a spacer etch process according to an embodiment utilizing a post deposition treatment and nitridation.
Figure 16B:
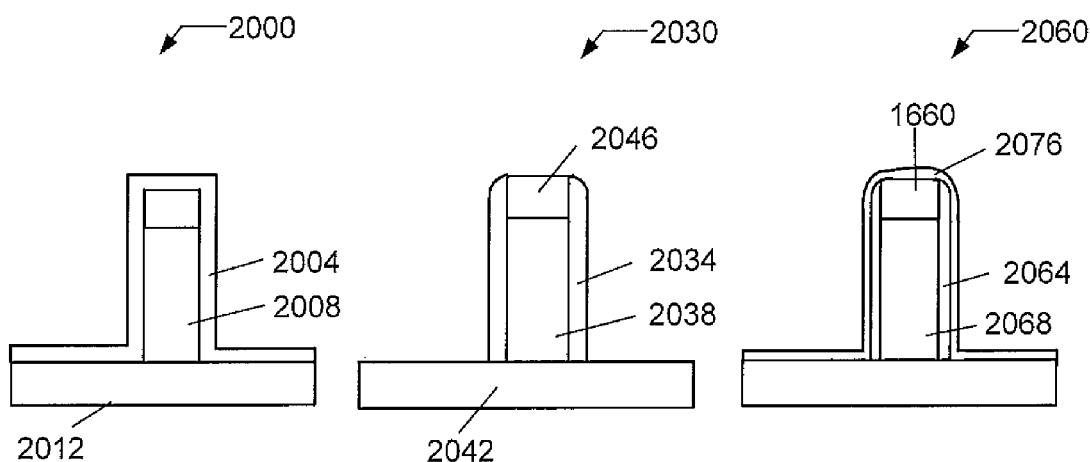
FIG. 16B depicts a schematic representation of a method for performing a spacer etch process according to an embodiment utilizing a post spacer reaction in etch (RIE) and nitridation treatment.
Figure 17A:
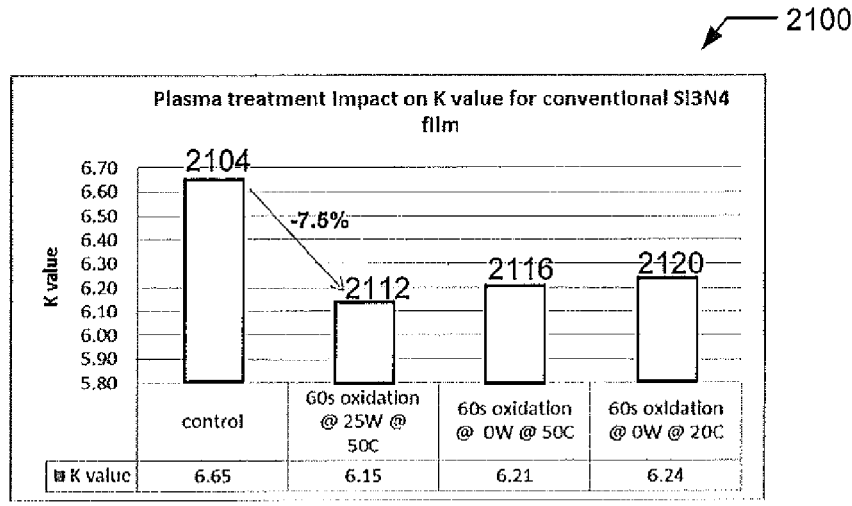
FIG. 17A represents an exemplary graph of change in K-value of conventional silicon nitride film after oxidation treatment.
Figure 17B:
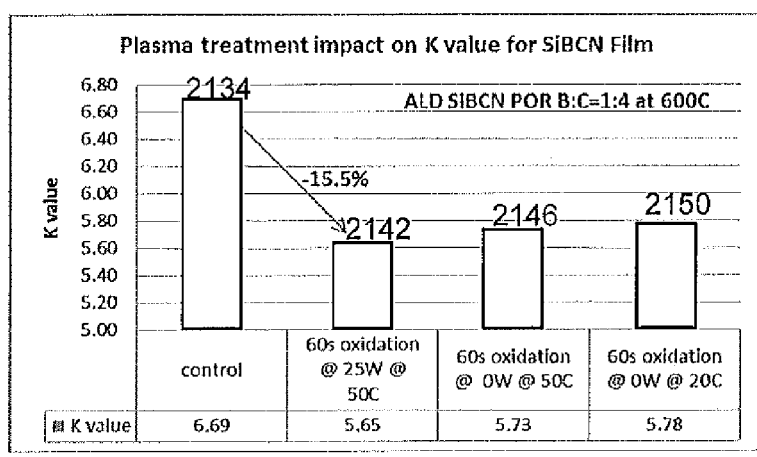
FIG. 17B represents an exemplary graph of change in K-value of SiBCN film after oxidation treatment using a first boron to carbon ratio.
Figure 17C:
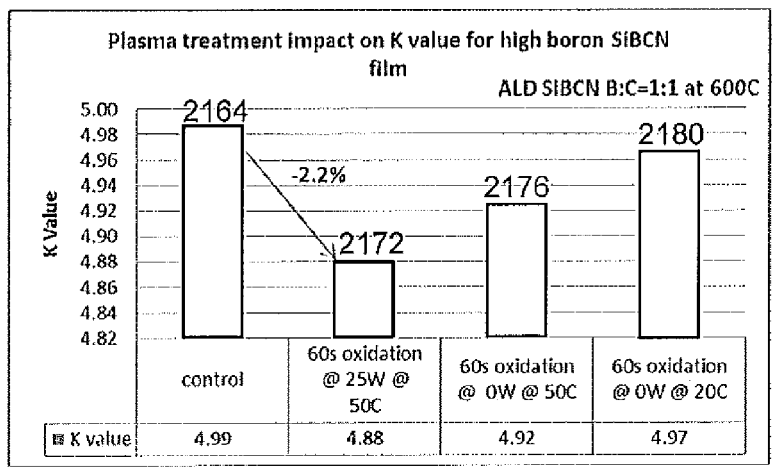
FIG. 17C represents an exemplary graph of change in K-value of SiBCN film after oxidation treatment using a second boron to carbon ratio.
Figure 18:
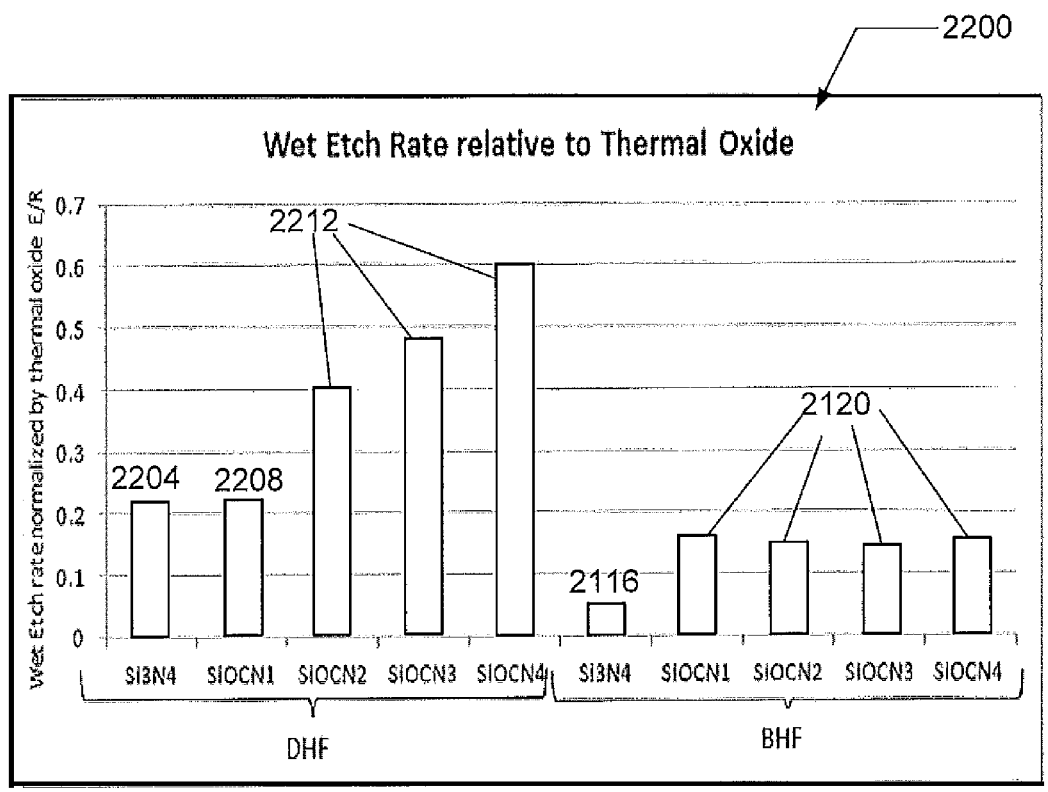
FIG. 18 represents an exemplary graph of wet etch rate of spacer materials compared to thermal oxide.

FIG. 15A through FIG. 18 will be discussed here to provide an explanation of the concepts and principles of the present invention. FIG. 15A, 15B, and FIG. 15C depicts a schematic representation of a method for performing a spacer etch process FIG. 15A depicts a schematic utilizing different points in the integration flow to perform the spacer etch processing. FIGS. 16A and 16B depicts a schematic representation of a method for performing a spacer etch process and nitridation at different points in the integration flow. FIGS. 17A, 17B, and 17C represents an exemplary graph of change in K-value of conventional silicon nitride film or SiBCN film; and FIG. 18 represents an exemplary graph of wet etch rate of spacer materials compared to thermal oxide.

FIG. 15A is a schematic representation of a method for performing a spacer etch process according to an embodiment utilizing a post deposition treatment and oxidation. A spacer material 1504 is conformally applied over a gate structure 1508 on a substrate 1512 in an etch system 1500. A surface of the spacer material 1534 conformally applied over the gate structure 1538 is exposed to an oxygen-containing environment in a etch system 1530, generating a spacer oxidation layer 1546. One or more spacer etch process sequences are performed in the etch system 1560 wherein the sidewall spacer 1556 is retained on the sidewall of the gate structure 1568 resulting in a bi-layer spacer 1556 with the spacer oxidation layer 1564 on the outer side of the spacer where the spacer has a lower final K-value. The conformal application of spacer material, exposure to an oxygen-containing environment, and performance of one or more etch process sequence can be done in different chambers or in the same chamber of the etch system.

Figure 15B:
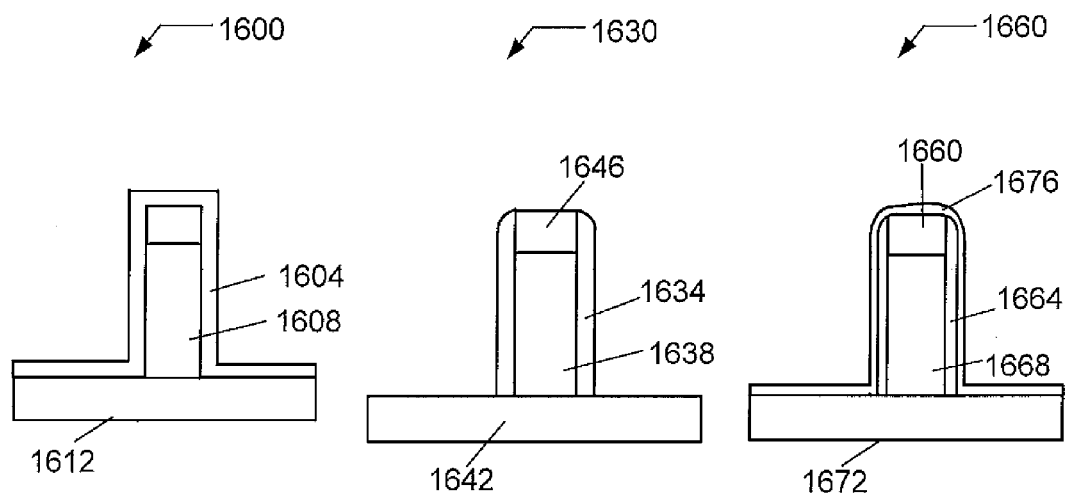
FIG. 15B depicts a schematic representation of a method for performing a spacer etch process according to an embodiment utilizing a post spacer reactive ion etching (RIE) treatment and oxidation.

FIG. 15B depicts a schematic representation of a method for performing a spacer etch process according to an embodiment utilizing a post spacer reactive ion etching (RIE) treatment and oxidation. A spacer material 1604 is conformally applied over a gate structure 1608 on a substrate 1612 in an etch system 1600. One or more spacer etch process sequences is performed in an etch system 1630 wherein the spacer material 1634 is etched off the cap 1446 of the gate structure 1638 and on the substrate while sidewall spacer 1634 is retained on the sidewall of the gate structure 1638 on the substrate 1642. In etch system 1660, the surface of the spacer material and the substrate is exposed to an oxygen-containing environment, generating a spacer oxidation layer with a lower final K-value.

Figure 15C:
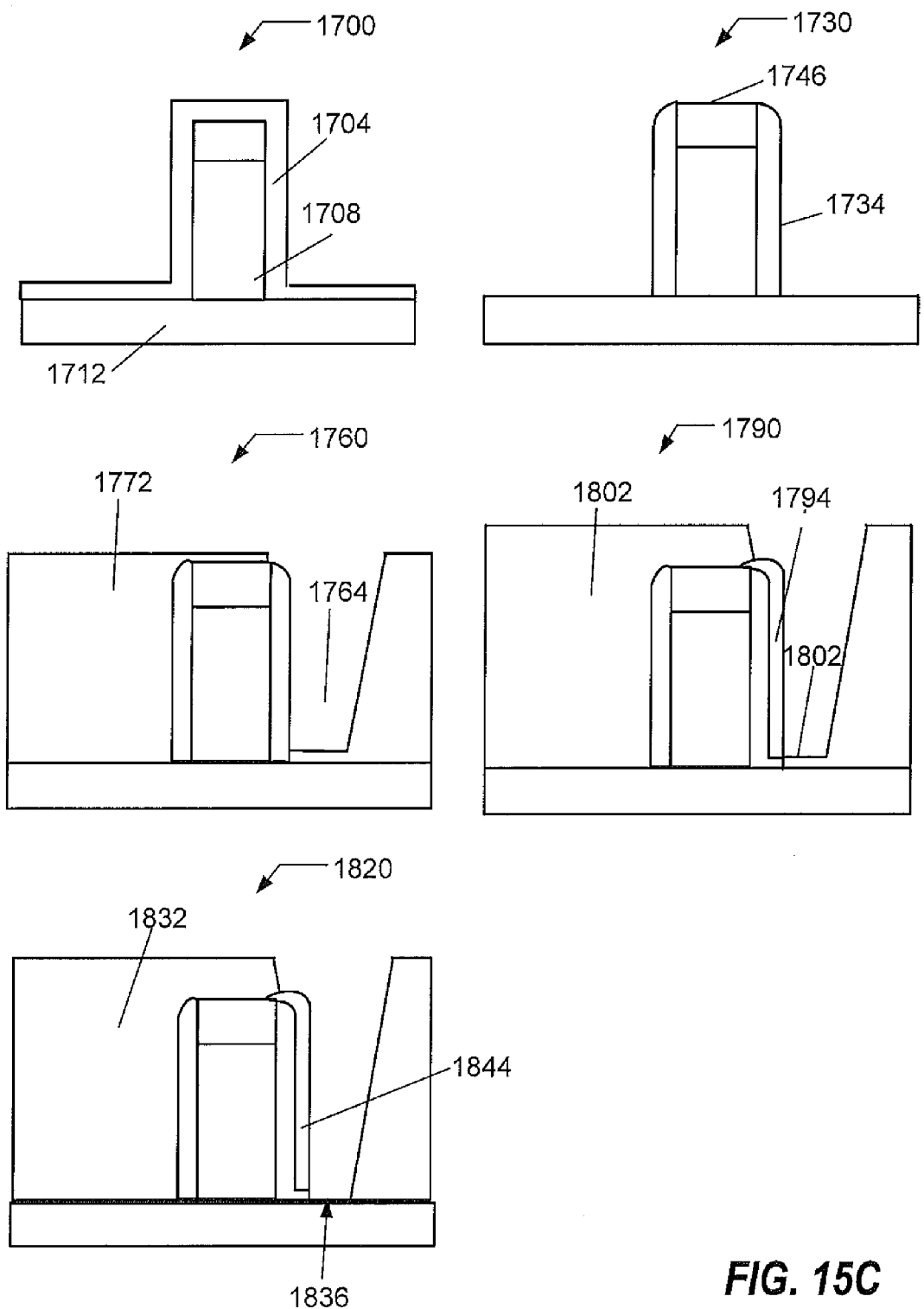
FIG. 15C depicts a schematic representation of a method for performing a spacer etch process according to an embodiment utilizing a post partial contact etch treatment and oxidation.

FIG. 15C depicts a schematic representation 1700 of a method for performing a spacer etch process according to an embodiment utilizing a post partial contact etch treatment and oxidation. A spacer material 1714 is conformally applied over a gate structure 1718 on a substrate 1722 in an etch system 1710. One or more spacer etch process sequences is performed in an etch system 1730 wherein the spacer material 1734 is etched off the cap 1746 of the gate structure 1738 and on the substrate 1742 while sidewall spacer 1734 is retained on the sidewall of the gate structure 1738. One or more deposition process sequences (not shown) is performed to generate an oxide fill layer 1772 above the gate structure 1778 and above the substrate 1772. A partial contact etch sequence is performed in etch system 1760 to etch one side of the oxide fill layer 1772 above the spacer 1764 leaving a small portion of the oxide fill layer 1776 near the bottom of the spacer 1764. The oxide fill layer 1802 is exposed to an oxygen-containing environment, creating a spacer oxidation layer 1794 on the one side of the spacer 1792 in etch system 1790. A finish-contact etch sequence is performed to remove the remaining small portion of the oxide fill layer 1826, shown as a dotted rectangle, near the bottom of the spacer 1884 in etch system 1820.

FIG. 16A depicts a schematic representation of a method for performing a spacer etch process according to an embodiment utilizing a post deposition treatment and nitridation. A spacer material 1904 is conformally applied over a gate structure 1908 on a substrate 1912 in an etch system 1900. A surface of the spacer material 1934 conformally applied over the gate structure 1938 is exposed to a nitrogen-containing environment in an etch system 1930, generating a spacer nitridation layer 1934. The nitrogen-containing environment can comprise ammonia NH3, nitrogen N2, hydrazine N2H4, or the like. One or more spacer etch process sequences is performed in an etch system 1960 wherein the sidewall spacer 1980 is retained on the sidewall of the gate structure 1968 resulting in a bi-layer spacer 1980 with the spacer oxidation layer 1964 on the outer side of the spacer 1980, where the spacer has an increased etch rate resistance to a treatment liquid comprising DHF or BHF.

FIG. 16B depicts a schematic representation of a method for performing a spacer etch process according to an embodiment utilizing a post deposition treatment and nitridation. A spacer material 2004 is conformally applied over a gate structure 2008 on a substrate 2012 in an etch system 2000. One or more spacer etch process sequences is performed in an etch system 2030 wherein the sidewall spacer 2034 is retained on the sidewall of the gate structure 2038. A surface of the spacer material 2064 conformally applied over the gate structure 2068 is exposed to a nitrogen-containing environment in a etch system 2060, generating a spacer nitridation layer 2076, where the spacer 2080 has an increased etch rate resistance to a treatment liquid comprising DHF or BHF. The nitrogen-containing environment can comprise ammonia NH3, nitrogen N2, hydrazine N2H4, or the like.

FIG. 17A represents an exemplary graph 2100 of change in K-value of conventional silicon nitride film after oxidation treatment. The control K-value 2104 of about 6.65 is for a silicon nitride film that was not exposed to an oxygen plasma treatment. A similar silicon nitride film was exposed to oxygen plasma for 60 seconds at 25 W power and 50° C. and the K-value was reduced to about 6.15 or 7.5% reduction. Similar lesser reductions were noted when similar film was exposed to oxygen plasma for 60 seconds at 0 W power and 50° C., the K-value was reduced to about 6.21, and when similar film was exposed to oxygen plasma for 60 seconds at 0 W power and 20° C., the K-value was reduced to about 6.24.

FIG. 17B represents an exemplary graph 2130 of change in K-value of SiBCN film after oxidation treatment using a 1:4 boron to carbon ratio. The control K-value 2134 of about 6.69 is for a SiBCN film that was not exposed to oxygen plasma treatment. A similar SiBCN film was exposed to oxygen plasma for 60 seconds at 25 W power and 50° C. and the K-value 2142 was reduced to about 5.65 or 15.5% reduction. Similar lesser reductions were noted when a similar film was exposed to oxygen plasma for 60 seconds at 0 W power and 50° C., the K-value 2146 was reduced to about 5.73, and when similar film was exposed to oxygen plasma for 60 seconds at 0 W power and 20° C., the K-value 2150 was reduced to about 5.78.

FIG. 17C represents an exemplary graph of change in K-value of SiBCN film after oxidation treatment using a 1:1 boron to carbon ratio. The control K-value 2164 of about 4.99 is for a SiBCN film that was not exposed to oxygen plasma treatment. A similar SiBCN film was exposed to oxygen plasma for 60 seconds at 25 W power and 50° C. and the K-value 2172 was reduced to about 4.88 or 2.2% reduction. Similar lesser reductions were noted when a similar film was exposed to oxygen plasma for 60 seconds at 0 W power and 50° C., the K-value 2176 was reduced to about 4.92, and when a similar film was exposed to oxygen plasma for 60 seconds at 0 W power and 20° C., the K-value 2180 was reduced to about 4.97. The K-value reduction is a function of the spacer film used, the length of oxidation time, power applied to the plasma, the chamber temperature and the ratio of boron or other elements added to the spacer film to carbon.

FIG. 18 represents an exemplary graph 2200 of wet etch rate of spacer materials compared to thermal oxide or silicon oxide. The silicon nitride etch rate 2204 is 0.25 of the thermal oxide etch rate using DHF and is used as a gauge as to whether the etch rate is in the acceptable range. The etch rate for SiOCN1 2208 film is roughly the same as the silicon nitride etch rate 2204 so that SiOCN1 etch rates 2208 would be acceptable as is. However, SiOCN2, SiOCN3, and SiOCN4 2212 are quite higher and would require the nitridation process to reduce the etch rates. In the BHF test, the silicon nitride 2116 etch rate is about 0.05 compared to the thermal oxide etch rate. SiOCN2, SiOCN3, and SiOCN4 etch rates 2120 are not close and would require the nitridation process to reduce the etch rates to the acceptable ranges.

Therefore, according to various embodiments, a method for performing a spacer etch process is described. The method is pictorially illustrated in FIGS. 2A through 2D, and presented by way of a flow chart 300, 330, 360 in FIGS. 3A, 3B, and 3C respectively. The schematic representation of the methods of performing spacer etch process in FIGS. 15A, 15B, and 15C can be used together with the aforementioned flowcharts.

Figure 2A:
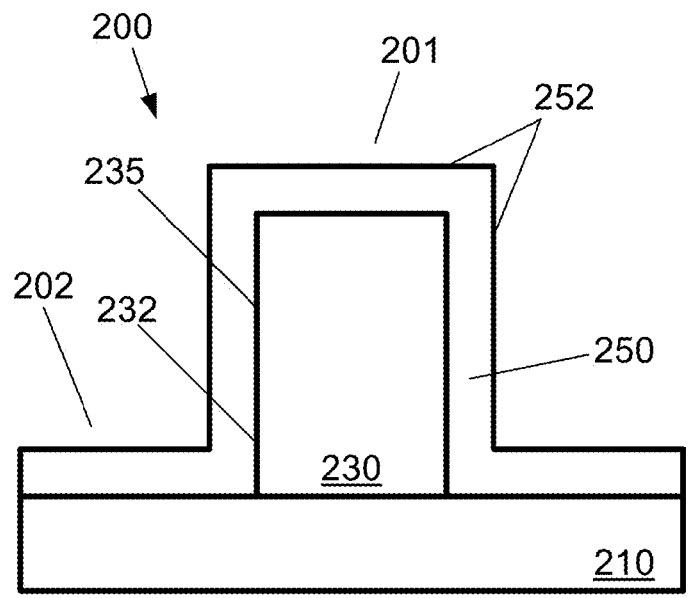
FIGS. 2A through 2D illustrate a schematic representation of a method for performing a spacer etch process according to an embodiment.
Figure 2B:
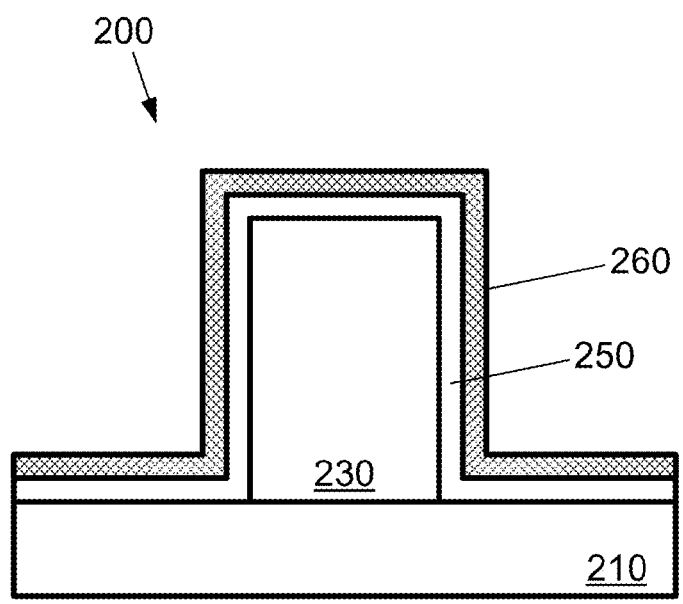
Figure 2C:
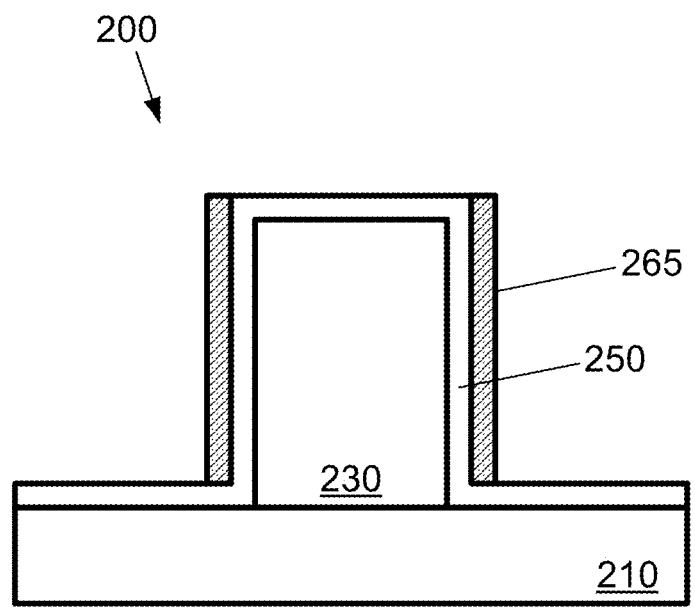
Figure 3A:
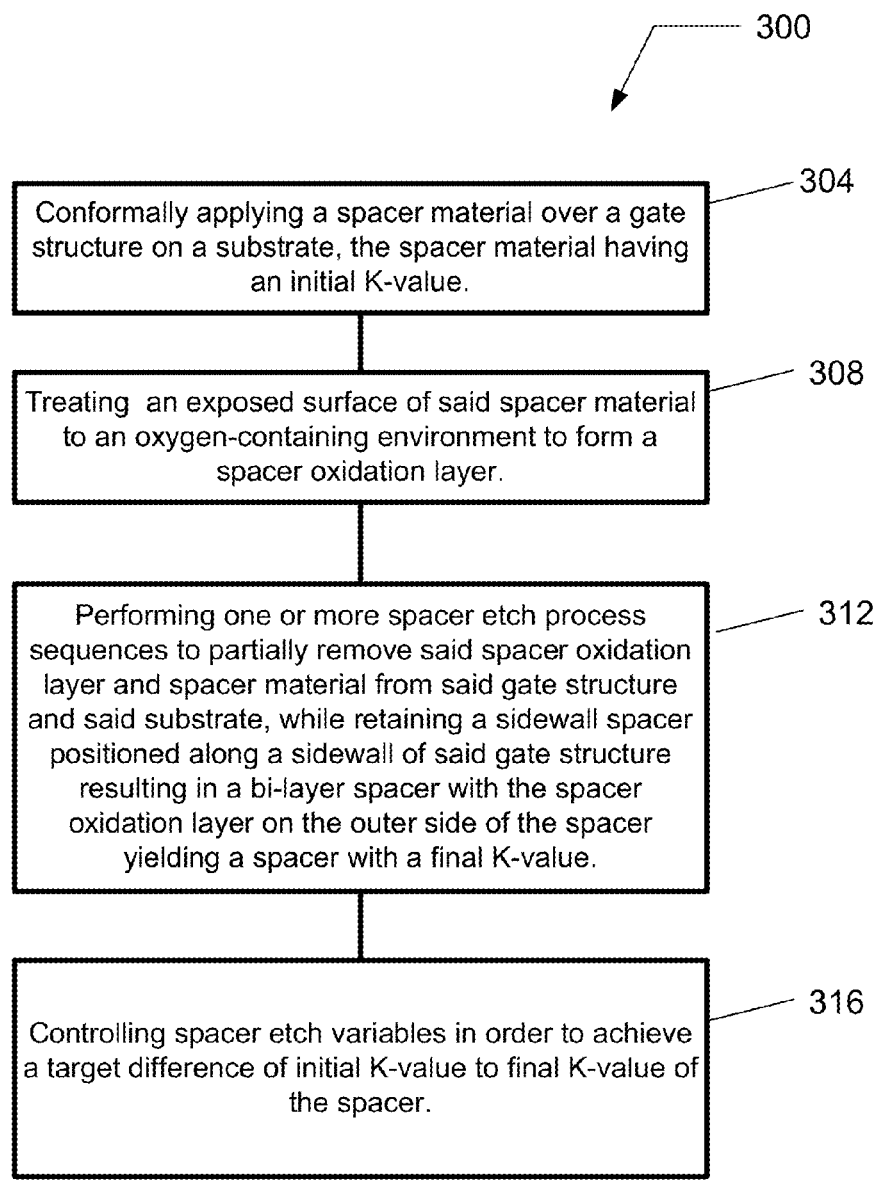
FIG. 3A depicts a flow chart illustrating methods for performing a spacer etch process according to an embodiment utilizing a post deposition and oxidation treatment.

As presented in FIG. 3A, the flow chart 300 begins in 304 with conformally applying a spacer material 250 over a gate structure 200 on a substrate 210 (see FIG. 2A). The spacer material 250 may include a nitride, such as silicon nitride ($Si_xN_y$). Additionally, the spacer material 250 may include a carbide, such as silicon carbide ($Si_xC_y$). Furthermore, the spacer material 250 may include a carbonitride, such as silicon carbonitride ($Si_xC_yN_z$). Further yet, the spacer material 250, conformally applied over the gate structure 200, may have a thickness less than or equal to about 20 nm, or less than or equal to about 10 nm.

The gate structure 200 comprises a patterned film stack of one or more layers 230 that may include, among other things, a gate capping layer, a gate electrode layer, a gate dielectric layer, a gate interfacial layer, etc. The gate capping layer may include an oxide, such as $SiO_2$.

The gate electrode layer may include a layer of polycrystalline silicon (polysilicon, or poly-Si) and/or a metal-containing layer. The metal-containing layer may include a metal, a metal alloy, a metal nitride, or a metal oxide, and may contain, for example, titanium, titanium aluminum alloy, tantalum, tantalum aluminum alloy, titanium nitride, titanium silicon nitride, titanium aluminum nitride, tantalum nitride, tantalum silicon nitride, hafnium nitride, hafnium silicon nitride, aluminum nitride, or aluminum oxide. The metal-containing layer may replace or be integrated with a traditional poly-Si gate electrode layer.

The gate dielectric may include $SiO_2$, or a high-k (high dielectric constant) layer, and may, for example, include a lanthanum-containing layer, such as lanthanum oxide (LaO), or a hafnium containing layer, such as a hafnium oxide layer (e.g., $HfO_x$, $HfO_2$), a hafnium silicate layer (e.g., HfSiO), or a nitrided hafnium silicate (e.g., HfSiO(N)). Additionally, for example, the high-k layer may incorporate metallic silicates or oxides (e.g., $Ta_2O_5$ (k.about.26), $TiO_2$ (k.about.80), $ZrO_2$ (k.about.25), $Al_2O_3$ (k.about.9), HfSiO, $HfO_2$ (k.about.25)). Furthermore, for example, the high-k layer may include mixed rare earth oxides, mixed rare earth aluminates, mixed rare earth nitrides, mixed rare earth aluminum nitrides, mixed rare earth oxynitrides, or mixed rare earth aluminum oxynitrides. The gate interfacial layer may include a thin layer of silicon dioxide ($SiO_2$) disposed between the high-k layer and the substrate 210.

The substrate 210 may include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof (Groups II, III, V, VI refer to the classical or old IUPAC notation in the Periodic Table of Elements; according to the revised or new IUPAC notation, these Groups would refer to Groups 2, 13, 15, 16, respectively). The substrate can be of any size, for example, a 200 mm (millimeter) substrate, a 300 mm substrate, a 450 mm substrate, or an even larger substrate.

In operation 308, an exposed surface of said spacer material is exposed to an oxygen-containing environment to form a spacer oxidation layer. The spacer oxidation layer 260 may be formed by exposing the spacer material 250 to an oxygen-containing environment. The oxygen-containing environment may include monatomic oxygen (O), diatomic oxygen ($O_2$), triatomic oxygen (ozone, $O_3$), an oxygen-containing molecule, ionized oxygen, metastable oxygen, or any excited state of oxygen, or any combination of two or more thereof. For example, the oxygen-containing environment may include an oxygen-containing plasma. Additionally, for example, the oxygen-containing environment may contain O, $O_2$, $O_3$, CO, $CO_2$, NO, $N_2O$, or $NO_2$, or any combination of two or more thereof. The oxygen-containing environment may be generated in-situ or ex-situ relative to substrate 210.

In operation 312, one or more spacer etch process sequences is performed to partially remove said spacer oxidation layer and spacer material from said gate structure and said substrate, while retaining a sidewall spacer positioned along a sidewall of said gate structure resulting in a bi-layer spacer with the spacer oxidation layer on the outer side of the spacer yielding a spacer with a final K-value. The one or more spacer etch process sequences can include a first etching process performed to anisotropically remove the spacer oxidation layer 260 from the spacer material 250 at the substrate region 202 on substrate 210 and the spacer material 250 at the capping region 201 of the gate structure 200 to leave behind a sidewall spacer oxidation layer 265 (see FIG. 2C).

The first etching process may include forming plasma from a first etching process composition that contains a halomethane gas. The halomethane gas may include a mono-substituted halomethane (e.g., $CH_3F$), a di-substituted halomethane (e.g., $CH_2F_2$), a tri-substituted halomethane (e.g., $CHF_3$), or a tetra-substituted halomethane (e.g., $CF_4$).

Additionally, for example, the first etching process composition may include any fluorocarbon gas $C_xH_yF_z$ combined with an oxidant such as O2 or CO2 or a reductant such as H2 and diluent such as Ar or He. As described above, substrate 210 is exposed to the plasma to anisotropically remove the spacer oxidation layer 260 from the spacer material 250. The first etching process may include preparation of a first etch process recipe. The first etch process recipe may include one or more process conditions defined by one or more process parameters. The one or more process conditions may be established by setting one or more process parameters, such as: setting a flow rate of the process composition; setting a pressure in the plasma processing system; setting a first radio frequency (RF) power level for a first RF signal applied to a lower electrode within a substrate holder for supporting and electrically biasing the substrate; setting a second RF (or microwave) power level for a second RF signal applied to a source antenna or electrode opposing the lower electrode above the substrate; setting a temperature condition for the plasma processing system; setting a temperature condition for the substrate or substrate holder; setting an etch time; and/or setting an over-etch time. During the first etching process, any one of the process parameters may be varied.

In one embodiment, the first etching process may comprise a process parameter space that includes: a chamber pressure ranging up to about 20 mtorr (millitorr), or less than 20 mTorr,), a process gas (e.g., $CF_4$) flow rate ranging up to about 2000 sccm (standard cubic centimeters per minute) (e.g., up to about 400 sccm, an optional noble gas (e.g., He or Ar) flow rate ranging up to about 400 sccm, a SWP (surface wave plasma) source (e.g., element 1130 in FIG. 11) power ranging up to about 3000 W (watts) (e.g., up to about 2500 W, or ranging from about 1500 W to about 2500 W), and a lower electrode (e.g., element 522 in FIG. 11) RF power level for electrically biasing the substrate ranging up to about 0 to −25 W. Also, the SWP source can operate at a microwave frequency, e.g., 2.48 GHz. In addition, the lower electrode bias frequency can range from about 0.1 MHz to about 100 MHz, e.g., about 2 MHz or 13.56 MHz.

Figure 2D:
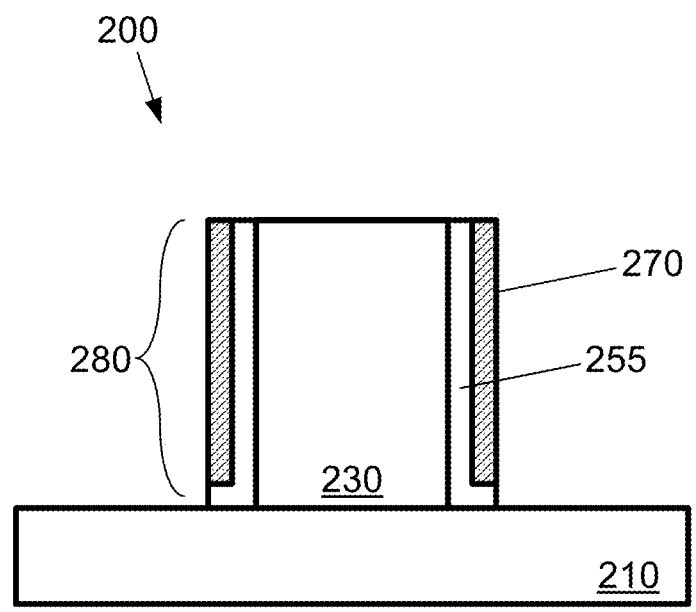

Operation 312 can include a second etching process performed to selectively remove the spacer material 250 from the substrate region 202 on substrate 210 and the capping region 201 of the gate structure 200 to leave behind the spacer sidewall 280, which may include sidewall spacer material 255 and a reduced sidewall spacer oxidation layer 270, on the sidewall 235 of the gate structure 200 (see FIG. 2D).

The second etching process may include forming plasma from a second etching process composition that contains a halomethane gas. The halomethane gas may include a mono-substituted halomethane (e.g., $CH_3F$), a di-substituted halomethane (e.g., $CH_2F_2$), a tri-substituted halomethane (e.g., $CHF_3$), or a tetra-substituted halomethane (e.g., $CF_4$).

Additionally, for example, the second etching process composition may include any fluorocarbon gas $C_xH_yF_z$ combined with an oxidant such as O2 or CO2 or a reductant such as H2 and diluent such as Ar or He. The second etching process composition may include a noble gas. The second etching process composition may include an oxygen-containing gas, a hydrogen-containing gas, a nitrogen-containing gas, or a carbon-containing gas, or any combination of two or more thereof. For example, the second etching process composition may include $H_2$, $O_2$, $N_2$, CO, $CO_2$, $NH_3$, NO, $N_2O$, or $NO_2$, or any combination of two or more thereof. The second etching process composition may further include a fluorine-containing gas, a chlorine-containing gas, a bromine-containing gas, or a halide gas. For example, the second etching process composition may further include HBr, $F_2$, $Cl_2$, $Br_2$, $BCl_3$, $NF_3$, or $SF_6$.

To form the plasma in the second etching process, constituents of the etching process composition should be selected that exist in a gaseous and/or vapor phase either alone or in combination with a carrier gas (e.g., a noble gas element or nitrogen) at atmospheric and/or vacuum pressures.

In one embodiment, the second etching process composition may include CHF, $O_2$, and Ar.

As described above, substrate 210 is exposed to the plasma to selectively remove the spacer material 250 from the substrate region 202 on substrate 210 and the capping region 201 of the gate structure 200. The second etching process may include preparation of a second etch process recipe. The second etch process recipe may include one or more process conditions defined by one or more process parameters. The one or more process conditions may be established by setting one or more process parameters, such as: setting a flow rate of the process composition; setting a pressure in the plasma processing system; setting a first radio frequency (RF) power level for a first RF signal applied to a lower electrode within a substrate holder for supporting and electrically biasing the substrate; setting a second RF (or microwave) power level for a second RF signal applied to a source antenna or electrode opposing the lower electrode above the substrate; setting a temperature condition for the plasma processing system; setting a temperature condition for the substrate or substrate holder; setting an etch time; and/or setting an over-etch time. During the first etching process, any one of the process parameters may be varied.

In one embodiment, the oxidation process, the first etching process, and the second etching process are performed in the same plasma processing system. In an alternate embodiment, the oxidation process, the first etching process, and the second etching process are performed in separate plasma processing systems.

In another embodiment, the oxidation process, the first etching process, and the second etching process are repeated multiple cycles, e.g., two or more cycles until the spacer material 250 is removed from the substrate region 202 on substrate 210 and the capping region 201 of the gate structure 200 to leave behind the spacer sidewall 280.

In yet another embodiment, an over-etch process may be performed.

In one example, Table 1 provides exemplary process conditions for a spacer etch process sequence. The spacer etch process sequence includes: (A) an oxidation process that utilizes an oxygen-containing plasma containing a $O_2$; (B) a first etching process that utilizes plasma formed of a process composition containing a $CF_4$ and Ar; and (C) a second etching process that utilizes plasma formed of a process composition containing a $CH_3F$, $O_2$, and Ar. The oxidation process, the first etching process, and the second etching process are performed in a plasma processing system, such as the system depicted in FIG. 11.

Figure 11:
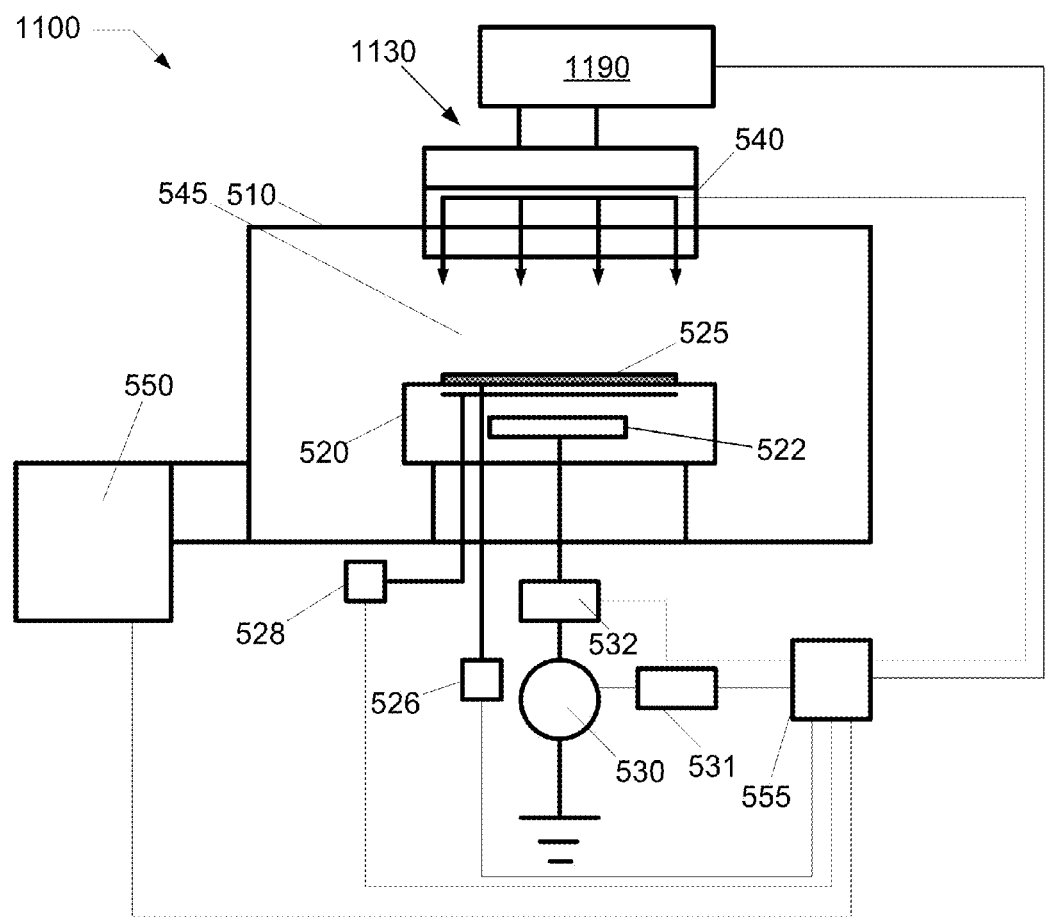
FIG. 11 shows a schematic representation of a plasma processing system according to another embodiment.

The plasma processing system depicted in FIG. 11 includes a surface wave plasma (SWP) source that comprises a slot antenna, such as a radial line slot antenna (RLSA). Plasma formed using RLSA has many characteristics including, but not limited to, a plasma with lower electron temperature and ion energy compared to other plasma sources. For a given substrate bias, the RLSA plasma will have a lower ion energy compared to a conventional radio frequency (RF) plasma. The inventors believe that this feature may be especially useful for achieving a low recess during an over-etch step.

The inventors suspect that the ion energy incident on the substrate is directly correlated to the oxide layer thickness created as a result of etching which in turn causes recess formation. In the spacer etch process sequence, low ion energy may be important for minimum recess. This feature may not be specific to the sequence described in Table 1, but it may be important for the over-etch step.

the bulk Si pFET. Using the spacer etch process sequence of Table 1, a sidewall spacer was produced having less than 1 nm spacer material CD reduction or slimming. The sidewall spacer exhibited no observable footing and substantially no recess at the substrate region of the substrate (e.g., <1 nm). Furthermore, the spacer recess was less than 5% and the uniformity was less than 10% C/E. The gate capping layer, which included $SiO_2$, had an initial capping layer thickness of about 15 nm and was reduced to 11.6 nm in both cases.

TABLE 2

| Performance Metric | Spacer Etch Requirement | Actual C/E FDSOA PFET | Actual C/E BULK PFET |
|---|---|---|---|
| Spacer material CD (final) | >8 nm | 8.2/8.7 nm | 8.8/8.5 nm |
| Profile (footing) | 0 nm | 0/0 nm | 0/0 nm |
| Substrate recess (SiGe) | <1 nm | NA | 0/0 nm |
| Spacer recess (Si) | <1 nm | 0/0 nm | NA |
| Spacer recess (SiN) | <5 nm | <5 nm | <5 nm |
| Uniformity | 8% | 9.70% | 9.70% |

One or more of the methods for performing a spacer etch process sequence described above may be performed utilizing a plasma processing system such as the one described in FIG. 11. However, the methods discussed are not to be limited in scope by this exemplary presentation. The method for performing the one or more spacer etch process sequences according to various embodiments described above may be performed in any one of the plasma processing systems illustrated in FIGS. 5 through 11 and described below.

Referring to FIG. 3A, in operation 316, spacer etch variables are controlled in order to achieve a target difference of initial K-value to final K-value of the spacer. The spacer etch variables include the power to the processing system in the

TABLE 1

| Process Description | UEL RF (W) | LEL RF (W) | p (mTorr) | T (° C.) (LEL-C, LEL-E) | CFR | $CF_4$ (sccm) | Ar (sccm) | $O_2$ (sccm) | $CH_3F$ (sccm) | Time (sccm) |
|---|---|---|---|---|---|---|---|---|---|---|
| (A) Oxidation process | 3000 | 0 | 20 | 30/30 | 70 | 0 | 0 | 350 | 0 | 60 |
| (B) First etching process | 2000 | 220 | 20 | 30/30 | 5 | 50 | 1000 | 0 | 0 | 4 |
| (C) Second etching process | 1800 | 25 | 100 | 30/30 | 5 | 0 | 1000 | 16 | 20 | 20/30 |

For each etch process, a process condition is recited including an order for the etch steps in each etch process, an upper electrode (UEL) power (watts, W; e.g., microwave or RF power to upper electrode or antenna), a lower electrode (LEL) power (watts, W), a gas pressure (millitorr, mtorr) in the plasma processing chamber, a temperature set for components in the plasma processing chamber (.degree. C.) ("LEL-C"=Lower electrode center temperature; "LEL-E"=Lower electrode edge temperature), a $CF_4$ flow rate (standard cubic centimeters per minute, sccm), an Ar flow rate, an $O_2$ flow rate, a $CH_3F$ flow rate, and time (sec, seconds). For the second etching process, the etch time was 20 sec for a bulk silicon substrate and 30 sec for a fully depleted silicon-on-insulator (SOI) substrate.

Table 2 provides results for performing the spacer etch process sequence on a bulk silicon pFET (positive channel field effect transistor) and a fully depleted SOI pFET. The spacer material included silicon nitride and was deposited with an initial spacer material CD of 9 nm. Table 2 provides the spacer etch requirement, as well as the actual data, including center (C)-edge (E) data, for both the FDSOI pFET and range of 0 to 3,000 W, the pressure in processing chamber is in a range from 5 to 20 mTorr, the temperature in the processing chamber is in a range of 20 to 100° C. or in a range from 50 to 100° C., the lower bias is in a range from 0 to −25 W, time for the one or more spacer etch process sequences is from 60 to 120 s, the oxygen flow rate is from 300 to 400 sccm, reduction of K-value is from 2 to 16%, oxidized layer thickness from 1.5 to 3.5 nm in the top cap, substrate, and sidewalls. Control is performed using a logic circuitry or stored computer program in a controller. The control process may be stored as one or more recipes or procedures. The controller can optimize two or more of the selected spacer etch variables in order to meet spacer etch objective, for example, a target difference of initial K-value to final K-value of the spacer and/or target wet resistance to wet etch treatment liquids. For example, in operation 316, the target difference of initial K-value to final K-value of the spacer may be set at 15% or more.

Figure 3B:
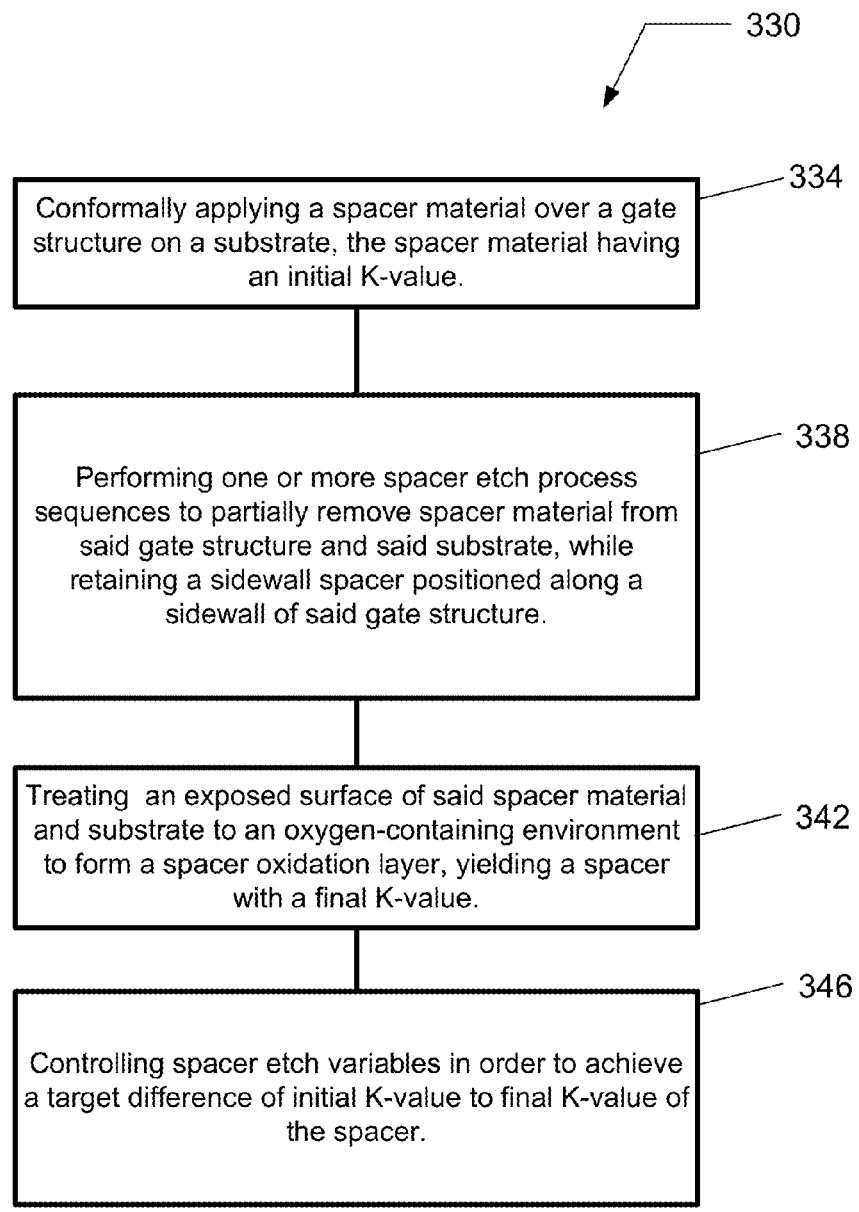
FIG. 3B depicts a flow chart illustrating methods for performing a spacer etch process according to an embodiment utilizing a post spacer reaction-in-etch (RIE) and oxidation treatment.

Referring to FIG. 3B, the flow chart 330 begins in 334 with conformally applying a spacer material 250 over a gate structure 200 on a substrate 210 (see FIG. 2A). The spacer material 250 may include a nitride, such as silicon nitride ($Si_xN_y$). Additionally, the spacer material 250 may include a carbide, such as silicon carbide ($Si_xC_y$). Furthermore, the spacer material 250 may include a carbonitride, such as silicon carbonitride ($Si_xC_yN_z$). Further yet, the spacer material 250, conformally applied over the gate structure 200, may have a thickness less than or equal to about 20 nm, or less than or equal to about 10 nm. The gate structure 200 comprising a gate capping layer, a gate electrode layer, a gate dielectric layer, and a gate interfacial layer are designed and fabricated similar to operation 304 of FIG. 3A.

Referring to FIG. 3B, operation 338 for performing one or more spacer etch process sequences to partially remove said spacer oxidation layer and spacer material from said gate structure and said substrate, while retaining a sidewall spacer positioned along a sidewall of said gate structure is similar to operation 312 of FIG. 3A; thus, the specifications will not be repeated here.

In operation 342, a surface of said spacer material and said substrate is exposed to an oxygen-containing environment to form a spacer oxidation layer at the same time, yielding a spacer with a final K-value. The extent of impact to the substrate and underlying structures in the substrate due to the exposure to the oxygen-containing environment is dependent on substrate type and integration scheme. Even if the impact is in the acceptable range, the impact should be minimized. In operation 346, the spacer etch variables are controlled in order to achieve a target difference of initial K-value to final K-value of the spacer, a process similar to operation 316 of FIG. 1. As mentioned above, control is performed using a logic circuitry or a stored computer program in a controller. The control process may be stored in the controller as one or more recipes or procedures. The controller can optimize two or more of the selected spacer etch variables in order to meet spacer etch objective, for example, a target difference of initial K-value to final K-value of the spacer and/or target wet resistance to wet etch treatment liquids. For example, in operation 346, the target difference of initial K-value to final K-value of the spacer may be set at 15% or more.

Figure 3C:
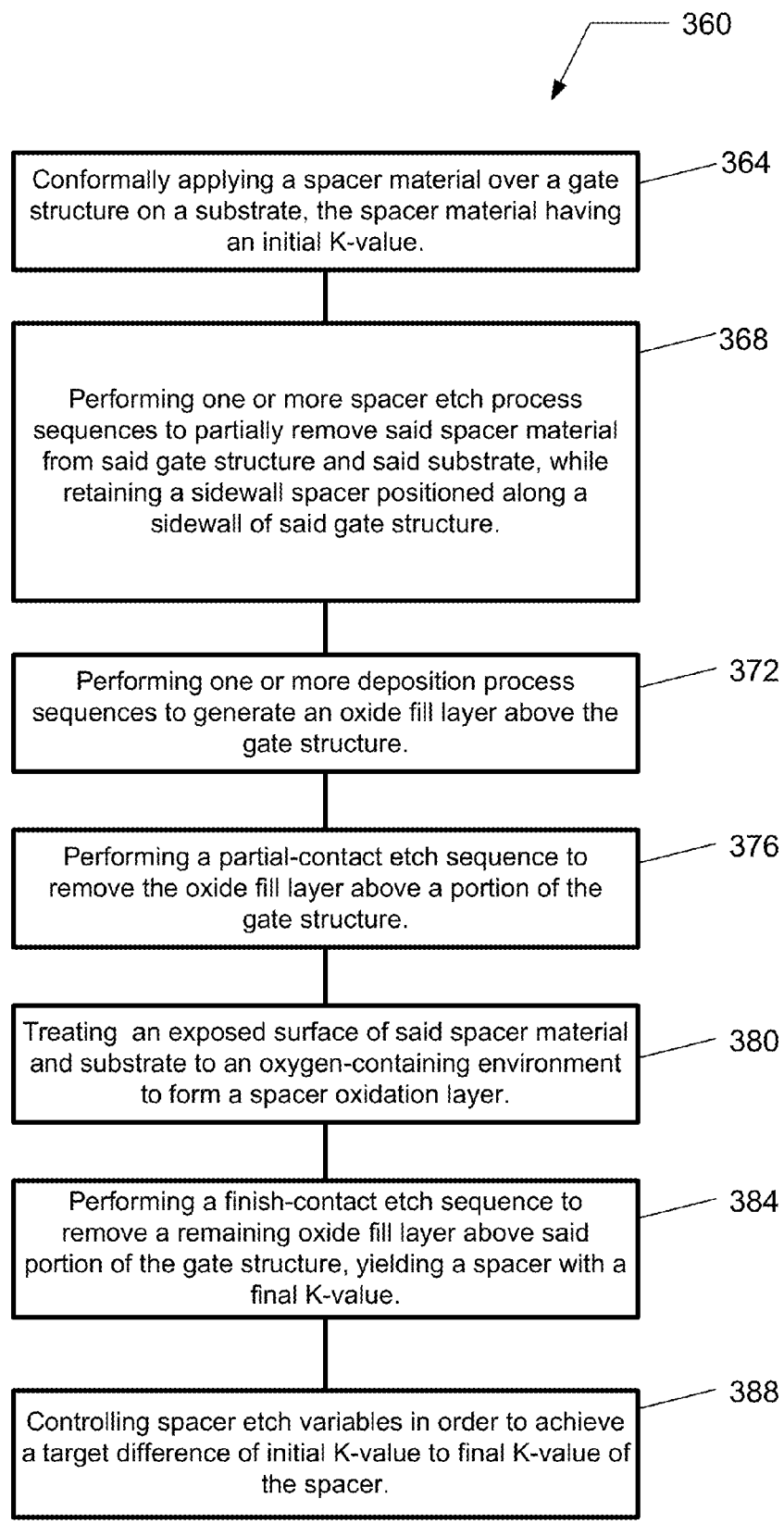
FIG. 3C depicts a flow chart illustrating methods for performing a spacer etch process according to an embodiment utilizing a post partial contact-etch and oxidation treatment.

Referring to FIG. 3C, the flow chart 360 begins in 364 with conformally applying a spacer material 250 over a gate structure 200 on a substrate 210 (see FIG. 2A). The spacer material 250 may include a nitride, such as silicon nitride ($Si_xN_y$). Additionally, the spacer material 250 may include a carbide, such as silicon carbide ($Si_xC_y$). Furthermore, the spacer material 250 may include a carbonitride, such as silicon carbonitride ($Si_xC_yN_z$). Further yet, the spacer material 250, conformally applied over the gate structure 200, may have a thickness less than or equal to about 20 nm, or less than or equal to about 10 nm. The gate structure 200 comprising a gate capping layer, a gate electrode layer, a gate dielectric layer, and a gate interfacial layer are designed and fabricated similar to operation 304 of FIG. 3A and the specifications shall not be repeated here.

Referring to FIG. 3C, operation 368 for performing one or more spacer etch process sequences to partially remove said spacer oxidation layer and spacer material from said gate structure and said substrate, while retaining a sidewall spacer positioned along a sidewall of said gate structure is similar to operation 312 of FIG. 3A, thus, the specifications will not be repeated here. In operation 372 of FIG. 3C, one or more deposition process sequences are performed to generate an oxide fill layer above the gate structure. The process used to generate an oxide layer fill is well known in the art.

In operation 376, a partial-contact etch sequence is performed to remove the oxide fill layer above a portion of the gate structure. Only one side of the spacer and a small portion of the cap layer proximate to the spacer is etched partially, leaving an oxide fill layer near the bottom with sufficient thickness to protect the underlying structures on the substrate. In operation 380, the surface of said portion of the cap layer, the spacer gate structure and oxide layer fill is exposed to an oxygen-containing environment to form a spacer oxidation layer. This etch process is similar to the oxidation performed in operation 308 of FIG. 3A and will not be repeated here.

In operation 384, a finish-contact etch sequence is performed to remove the remaining oxide fill layer above said portion of the substrate, yielding a spacer with a final K-value. In operation 388, two or more spacer etch variables are controlled in order to achieve a target difference of initial K-value to final K-value of the spacer. Operation 388 can be actively executing the control processes from the first operation (363) through the last operation (384) in order to produce a spacer with a K-value in the range needed to minimize the parasitic capacitances mentioned above.

Figure 4A:
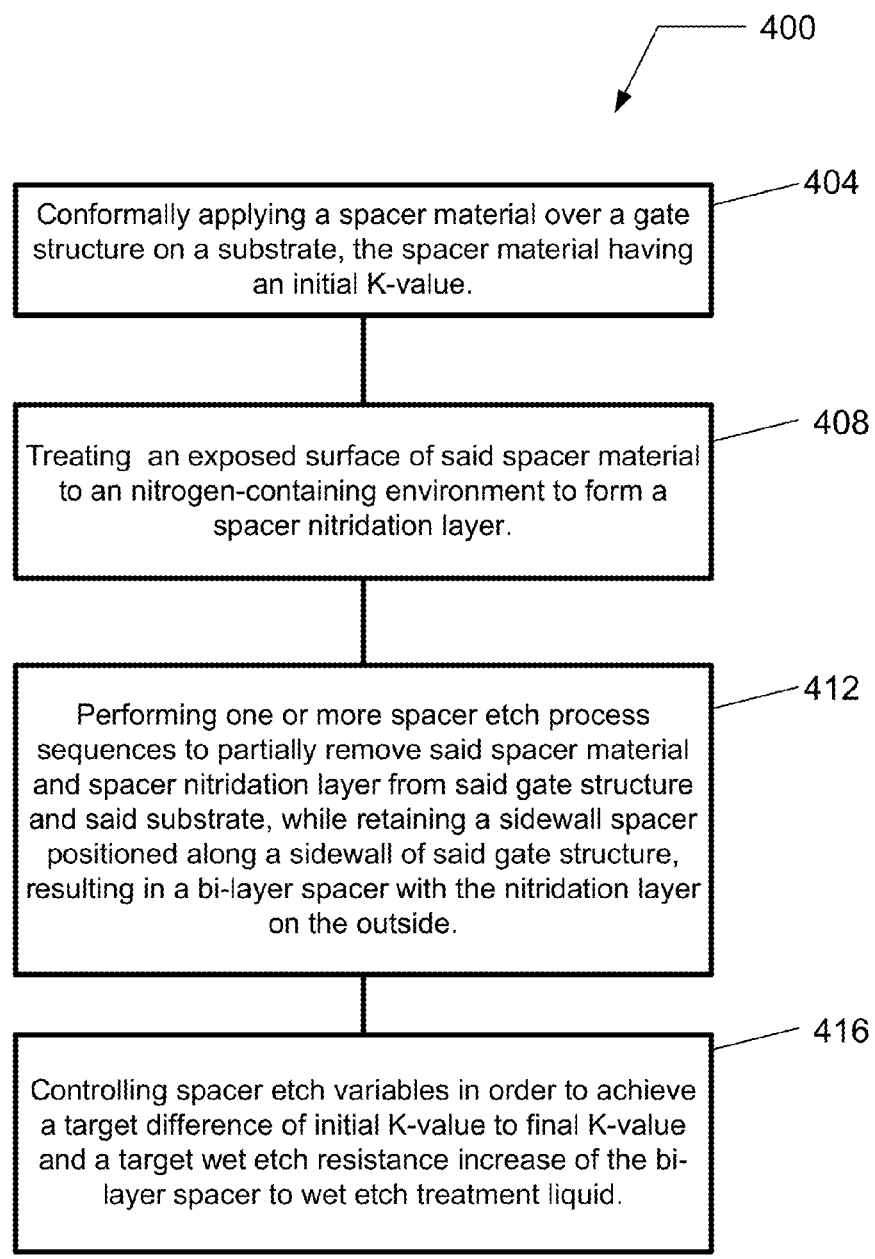
FIG. 4A depicts a flow chart illustrating methods for performing a spacer etch process according to an embodiment utilizing a post deposition and nitridation treatment.

FIG. 4A depicts a flow chart 400 illustrating methods for performing a spacer etch process according to an embodiment utilizing a post deposition and nitridation treatment. In operation 404, a spacer material is conformally applied over a gate structure on a substrate; the spacer material comprising SiON, SiOCN, or SiBCN. In operation 408, a surface of said spacer material covering the gate structure and substrate is exposed to a nitrogen-containing environment to form a spacer nitridation layer. The process of nitridation is similar to the process of oxidation as described in operation 308 in FIG. 3A, except where oxygen is replaced with nitrogen.

In operation 412, one or more spacer etch process sequences is performed to partially remove said spacer nitridation layer and spacer material from said gate structure and said substrate, while retaining a sidewall spacer positioned along a sidewall of said gate structure resulting in a bi-layer spacer with the spacer nitridation layer on the outside of the spacer. The processes and techniques described in relation to operation 312 of FIG. 3A are applicable to this step where one or more spacer etch process sequences is performed to partially remove said spacer nitridation layer and spacer material from said gate structure and said substrate, with the oxidation layer substituted with the nitridation layer. The result is a spacer with an increased resistance to the wet etch treatment liquid.

In operation 416, two or more spacer etch variables are controlled in order to achieve a target resistance to wet etch treatment liquids. Examples of wet etch treatment liquids include dilute hydrofluoric acid (DHF) or buffered hydrogen fluoride (BHF) solutions. When low K material such as SiON, SiOCN, or SiBCN are used, the etching selectivity or wet etch resistance to DHF or BHF decreases.

As materials with lower K values are needed, the oxygen and or boron content inside the film has to be increased, which causes an increase in the wet etch rate. For example, hydrogen fluoride (HF) dip wet etch can be very selective to Si3N4. Plasma nitridation of the spacer with 1-2 nm of low k material should be enough to confer etch resistance of the low K film exterior layers to match the wet etch resistance to that of conventional Si3N4. Comparison of wet etch rates of some low k films to thermal SiO2 wet etch rates in DHF and BHF solutions shows a need to lower the etch rate. For example, some SiOCN films have 1.6 to 2.4 times the etch rate compared to the Si3N4 IRAD 630C which is too high and not acceptable. The object is to reduce the etch rate to match that of Si3N4 which is around 0.25 that of thermal oxide, (as shown in FIG. 18), in order to be within the acceptable range for spacer etch applications. Thus, the need for controlling the nitridation process, operation 408, and the spacer etch process, operation 412, are critical in getting the objectives of spacer etching accomplished.

Figure 4B:
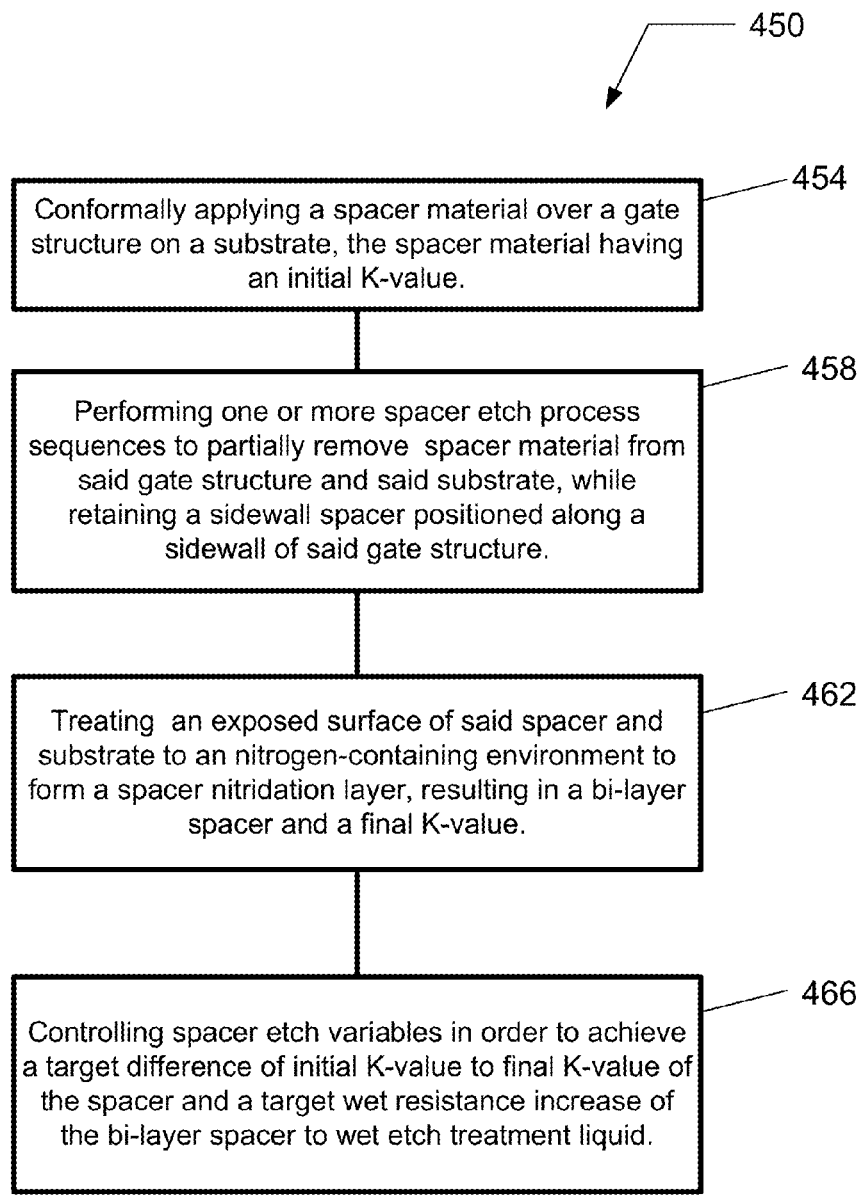
FIG. 4B depicts a flow chart illustrating methods for performing a spacer etch process according to an embodiment utilizing a post spacer RIE treatment and nitridation.

FIG. 4B depicts a flow chart 450 illustrating methods for performing a spacer etch process according to an embodiment utilizing a post spacer RIE and nitridation treatment. As presented in FIG. 4A, the flow chart 400 begins in 454 with conformally applying a spacer material 250 over a gate structure 200 on a substrate 210 (see FIG. 2A). Further, the spacer material 250, conformally applied over the gate structure 200, may have a thickness less than or equal to about 20 nm, or less than or equal to about 10 nm. The spacer material can comprise SiON, SiOCN, or SiBCN.

In operation 458, one or more spacer etch process sequences is performed to partially remove said spacer material from said gate structure and said substrate, while retaining a sidewall spacer positioned along a sidewall of said gate structure. The processes and techniques described in relation to operation 412 of FIG. 4B are applicable to this step where one or more spacer etch process sequences is performed to partially remove spacer material from said gate structure and said substrate. In operation 462, a surface of said spacer material covering the gate structure and substrate is exposed to a nitrogen-containing environment to form a spacer nitridation layer.

In operation 466, a plurality of spacer etch variables are controlled in order to achieve target wet resistance to wet etch treatment liquids. As mentioned above, examples of wet etch treatment liquids include dilute hydrofluoric acid (DHF) or buffered hydrogen fluoride (BHF) solutions. The object is to reduce the etch rate to match that of Si3N4 which is around 0.25 that of thermal oxide in order to be within the acceptable range for spacer etch applications. Thus, the need for controlling the two or more spacer etch process, operation 458, and the nitridation process, operation 462, are critical in getting the objectives of spacer etching accomplished. Variables related to integration scheme and substrate type need to be minimized or accounted for in the control procedures and selected range of the variables in order to meet the spacer etching objectives target wet etch resistance.

Figure 5:
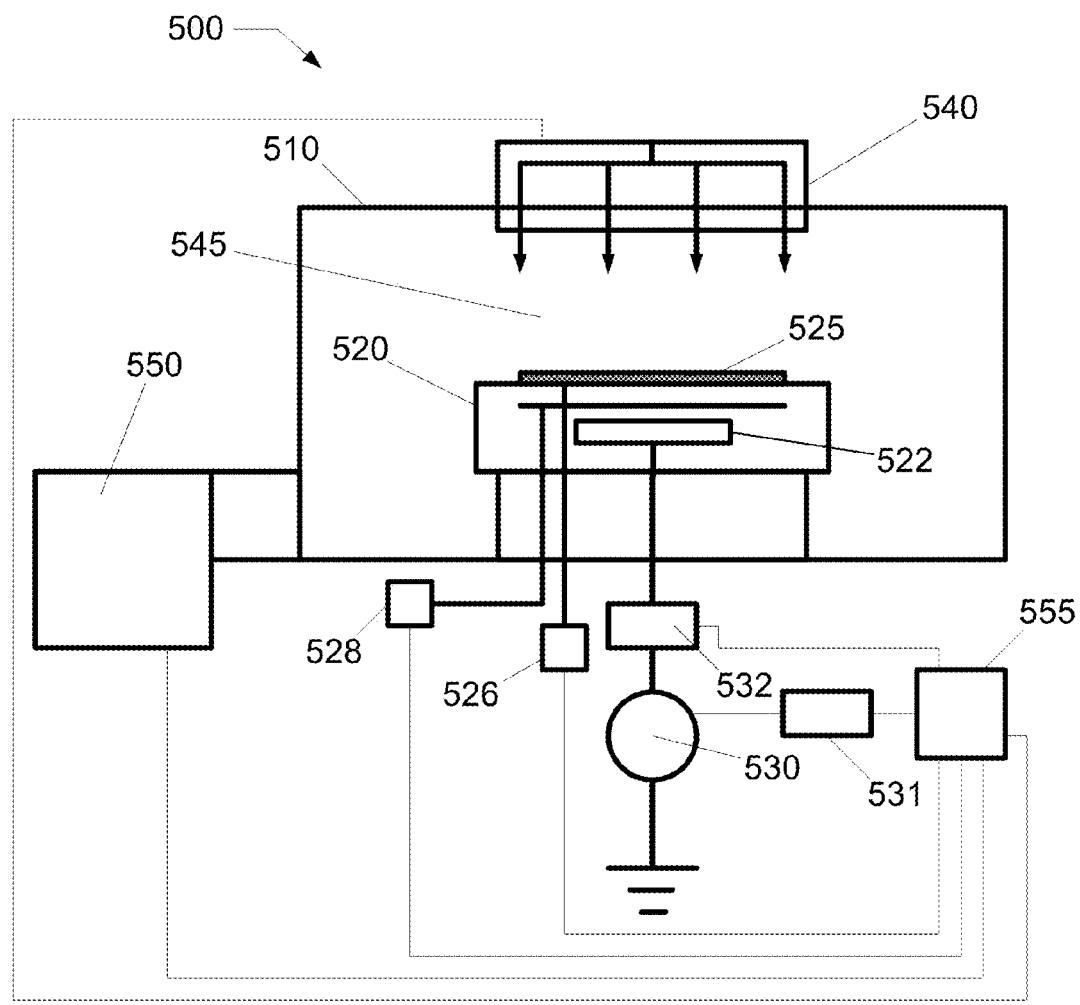
FIG. 5 shows a schematic representation of a plasma processing system according to an embodiment.

According to one embodiment, a plasma processing system 500 configured to perform the above identified process conditions is depicted in FIG. 5 comprising a plasma processing chamber 510, substrate holder 520, upon which a substrate 525 to be processed is affixed, and vacuum pumping system 550. Substrate 525 can be a semiconductor substrate, a wafer, a flat panel display, or a liquid crystal display. Plasma processing chamber 510 can be configured to facilitate the generation of plasma in plasma processing region 545 in the vicinity of a surface of substrate 525. An ionizable gas or mixture of process gases is introduced via a gas distribution system 540. For a given flow of process gas, the process pressure is adjusted using the vacuum pumping system 550. Plasma can be utilized to create materials specific to a predetermined materials process, and/or to aid the removal of material from the exposed surfaces of substrate 525. The plasma processing system 500 can be configured to process substrates of any desired size, such as 200 mm substrates, 300 mm substrates, or larger.

Substrate 525 can be affixed to the substrate holder 520 via a clamping system 528, such as a mechanical clamping system or an electrical clamping system (e.g., an electrostatic clamping system). Furthermore, substrate holder 520 can include a heating system (not shown) or a cooling system (not shown) that is configured to adjust and/or control the temperature of substrate holder 520 and substrate 525. The heating system or cooling system may comprise a re-circulating flow of heat transfer fluid that receives heat from substrate holder 520 and transfers heat to a heat exchanger system (not shown) when cooling, or transfers heat from the heat exchanger system to substrate holder 520 when heating. In other embodiments, heating/cooling elements, such as resistive heating elements, or thermo-electric heaters/coolers can be included in the substrate holder 520, as well as the chamber wall of the plasma processing chamber 510 and any other component within the plasma processing system 500.

Additionally, a heat transfer gas can be delivered to the backside of substrate 525 via a backside gas supply system 526 in order to improve the gas-gap thermal conductance between substrate 525 and substrate holder 520. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 525.

In the embodiment shown in FIG. 5, substrate holder 520 can comprise an electrode 522 through which RF power is coupled to the processing plasma in plasma processing region 545. For example, substrate holder 520 can be electrically biased at a RF voltage via the transmission of RF power from a RF generator 530 through an optional impedance match network 532 to substrate holder 520. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of electrode 522 at a RF voltage may be pulsed using pulsed bias signal controller 531. The RF power output from the RF generator 530 may be pulsed between an off-state and an on-state, for example.

Alternately, RF power is applied to the substrate holder electrode at multiple frequencies. Furthermore, impedance match network 532 can improve the transfer of RF power to plasma in plasma processing chamber 510 by reducing the reflected power. Match network topologies (e.g. L-type, .pi.-type, T-type, etc.) and automatic control methods are well known to those skilled in the art.

Gas distribution system 540 may comprise a showerhead design for introducing a mixture of process gases. Alternatively, gas distribution system 540 may comprise a multi-zone showerhead design for introducing a mixture of process gases and adjusting the distribution of the mixture of process gases above substrate 525. For example, the multi-zone showerhead design may be configured to adjust the process gas flow or composition to a substantially peripheral region above substrate 525 relative to the amount of process gas flow or composition to a substantially central region above substrate 525.

Vacuum pumping system 550 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 510.

Controller 555 comprises a microprocessor, memory, and a digital I/O port capable of generating control voltages sufficient to communicate and activate inputs to plasma processing system 500 as well as monitor outputs from plasma processing system 500. Moreover, controller 555 can be coupled to and can exchange information with RF generator 530, pulsed bias signal controller 531, impedance match network 532, the gas distribution system 540, vacuum pumping system 550, as well as the substrate heating/cooling system (not shown), the backside gas supply system 526, and/or the electrostatic clamping system 528. For example, a program stored in the memory can be utilized to activate the inputs to the aforementioned components of plasma processing system 500 according to a process recipe in order to perform a plasma assisted process, such as a plasma etch process, on substrate 525.

Controller 555 can be locally located relative to the plasma processing system 500, or it can be remotely located relative to the plasma processing system 500. For example, controller 555 can exchange data with plasma processing system 500 using a direct connection, an intranet, and/or the internet. Controller 555 can be coupled to an intranet at, for example, a customer site (i.e., a device maker, etc.), or it can be coupled to an intranet at, for example, a vendor site (i.e., an equipment manufacturer). Alternatively or additionally, controller 555 can be coupled to the internet. Furthermore, another computer (i.e., controller, server, etc.) can access controller 555 to exchange data via a direct connection, an intranet, and/or the internet.

In the embodiment shown in FIG. 6, plasma processing system 600 can be similar to the embodiment of FIG. 5 and further comprise either a stationary, or mechanically or electrically rotating magnetic field system 660, in order to potentially increase plasma density and/or improve plasma processing uniformity, in addition to those components described with reference to FIG. 5. Moreover, controller 555 can be coupled to magnetic field system 660 in order to regulate the speed of rotation and field strength. The design and implementation of a rotating magnetic field is well known to those skilled in the art.

Figure 6:
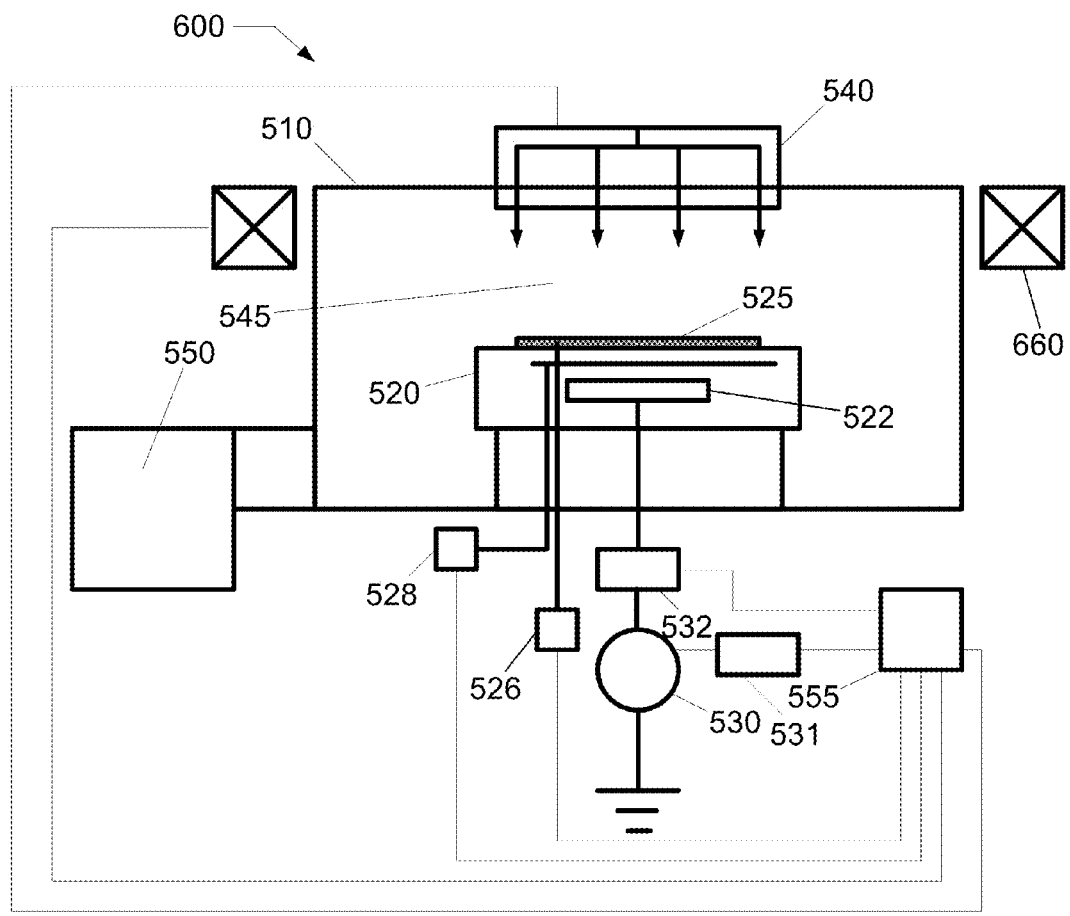
FIG. 6 shows a schematic representation of a plasma processing system according to another embodiment.
Figure 7:
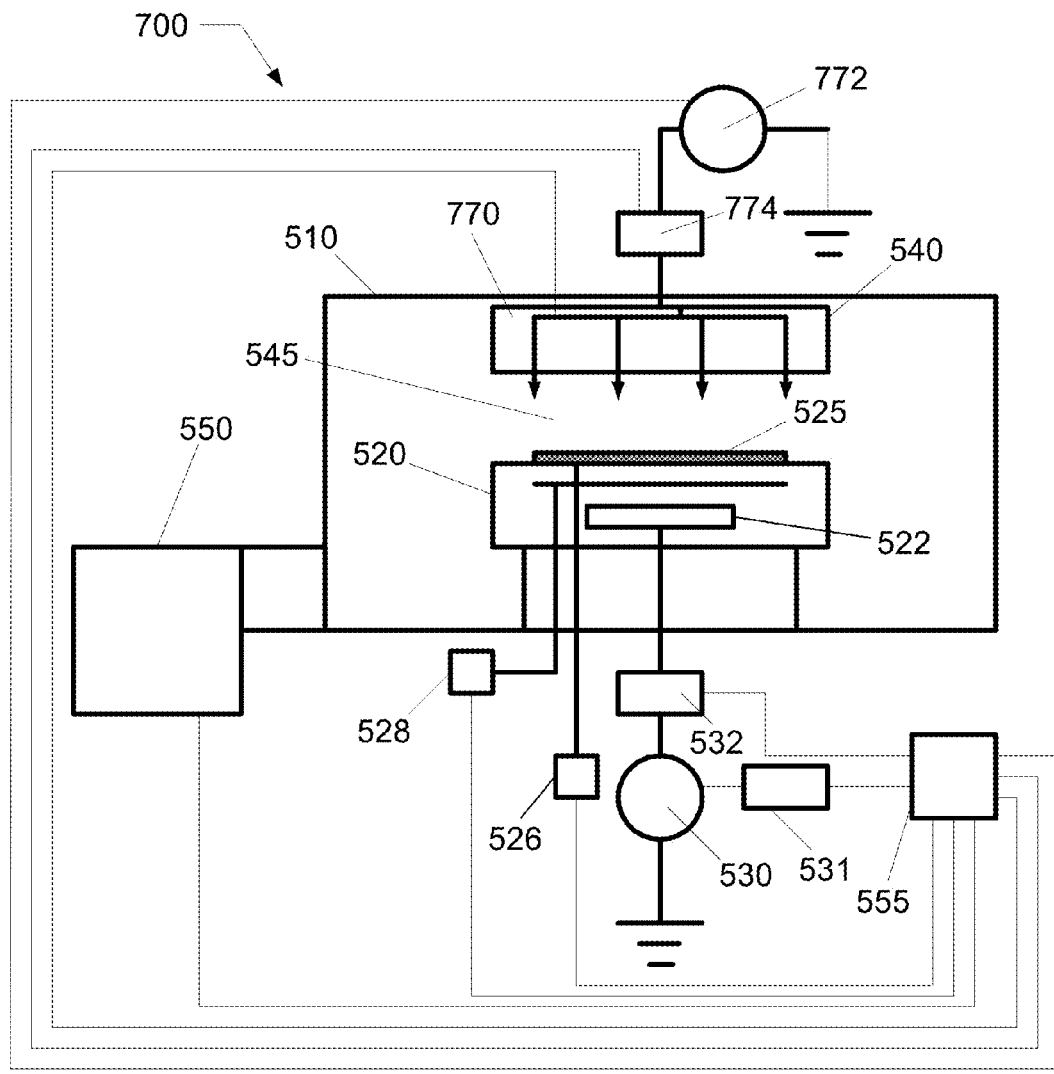
FIG. 7 shows a schematic representation of a plasma processing system according to another embodiment.

In the embodiment shown in FIG. 7, plasma processing system 700 can be similar to the embodiment of FIG. 5 or FIG. 6, and can further comprise an upper electrode 770 to which RF power can be coupled from RF generator 772 through optional impedance match network 774. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 555 is coupled to RF generator 772 and impedance match network 774 in order to control the application of RF power to upper electrode 770. The design and implementation of an upper electrode is well known to those skilled in the art. The upper electrode 770 and the gas distribution system 540 can be designed within the same chamber assembly, as shown. Alternatively, upper electrode 770 may comprise a multi-zone electrode design for adjusting the RF power distribution coupled to plasma above substrate 525. For example, the upper electrode 770 may be segmented into a center electrode and an edge electrode.

Figure 8:
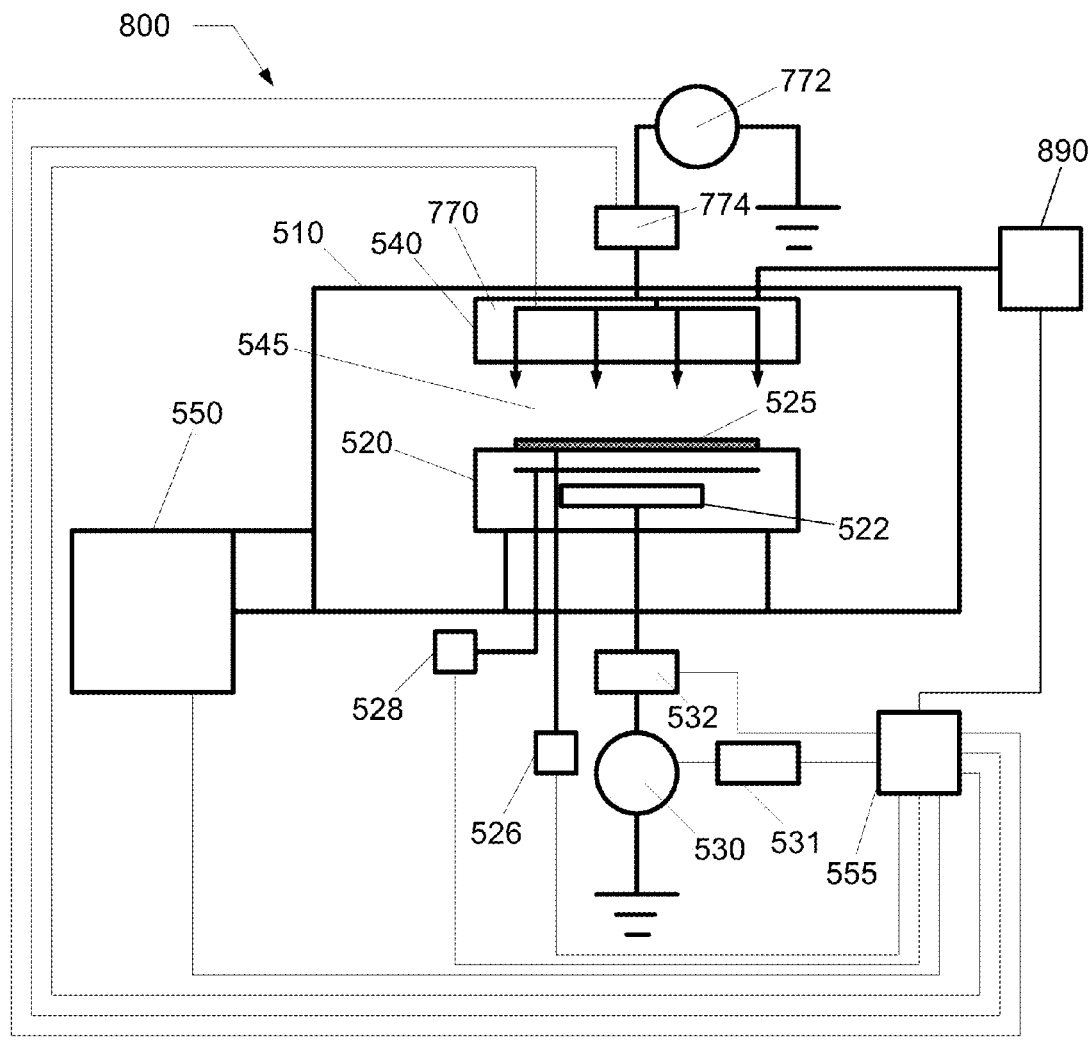
FIG. 8 shows a schematic representation of a plasma processing system according to another embodiment.

In the embodiment shown in FIG. 8, plasma processing system 800 can be similar to the embodiment of FIG. 7, and can further comprise a direct current (DC) power supply 890 coupled to the upper electrode 770 opposing substrate 525. The upper electrode 770 may comprise an electrode plate. The electrode plate may comprise a silicon-containing electrode plate. Moreover, the electrode plate may comprise a doped silicon electrode plate. The DC power supply 890 can include a variable DC power supply. Additionally, the DC power supply 890 can include a bipolar DC power supply. The DC power supply 890 can further include a system configured to perform at least one of monitoring, adjusting, or controlling the polarity, current, voltage, or on/off state of the DC power supply 890. Once plasma is formed, the DC power supply 890 facilitates the formation of a ballistic electron beam. An electrical filter (not shown) may be utilized to de-couple RF power from the DC power supply 890.

For example, the DC voltage applied to upper electrode 770 by DC power supply 890 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 770. The surface of the upper electrode 770 facing the substrate holder 520 may be comprised of a silicon-containing material.

Figure 9:
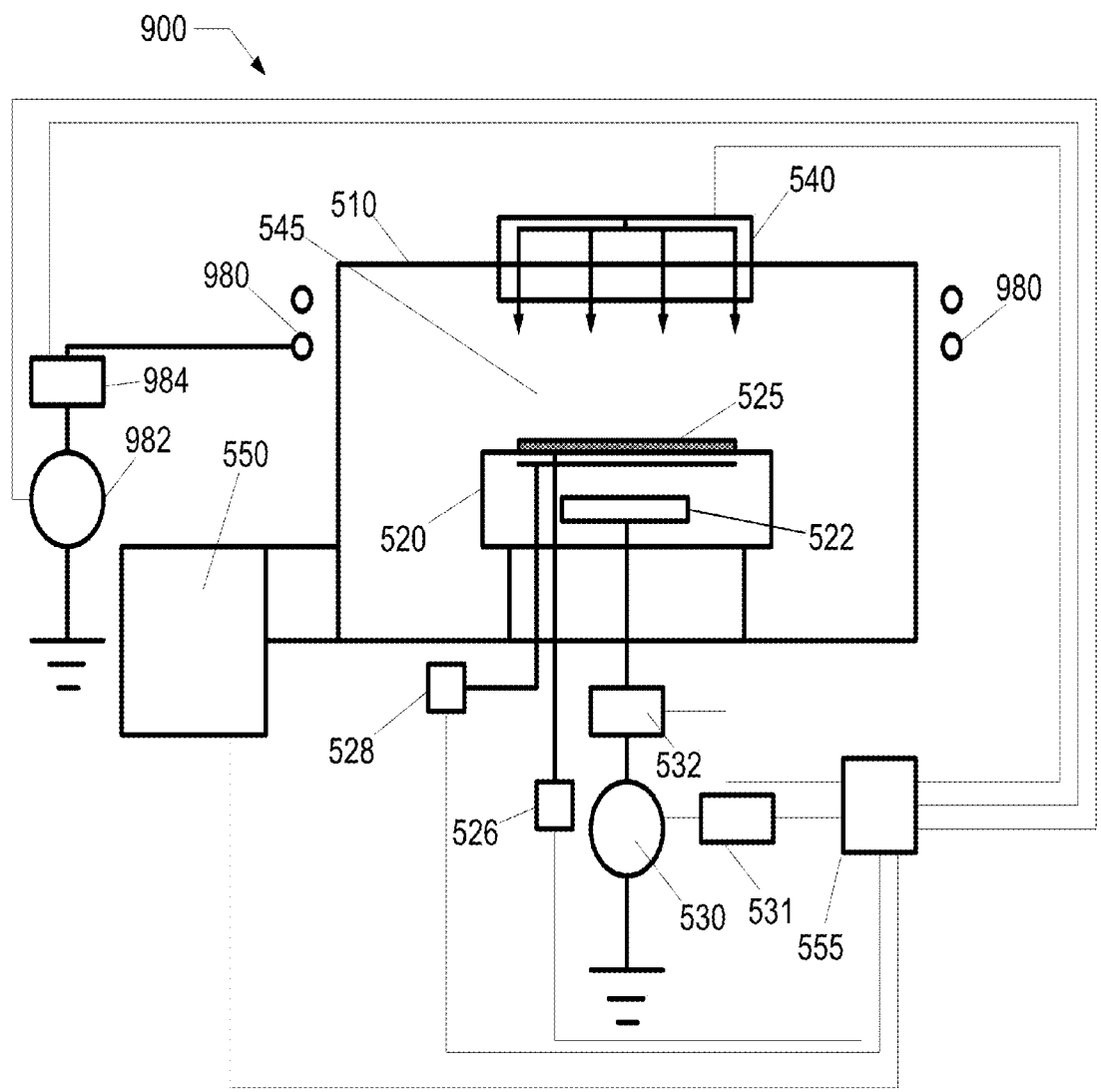
FIG. 9 shows a schematic representation of a plasma processing system according to another embodiment.

In the embodiment shown in FIG. 9, plasma processing system 900 can be similar to the embodiments of FIGS. 5 and 6, and can further comprise an inductive coil 980 to which RF power is coupled via RF generator 982 through optional impedance match network 984. RF power is inductively coupled from inductive coil 980 through a dielectric window (not shown) to plasma processing region 545. A frequency for the application of RF power to the inductive coil 980 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 980 and plasma in the plasma processing region 545. Moreover, controller 555 can be coupled to RF generator 982 and impedance match network 984 in order to control the application of power to inductive coil 980.

Figure 10:
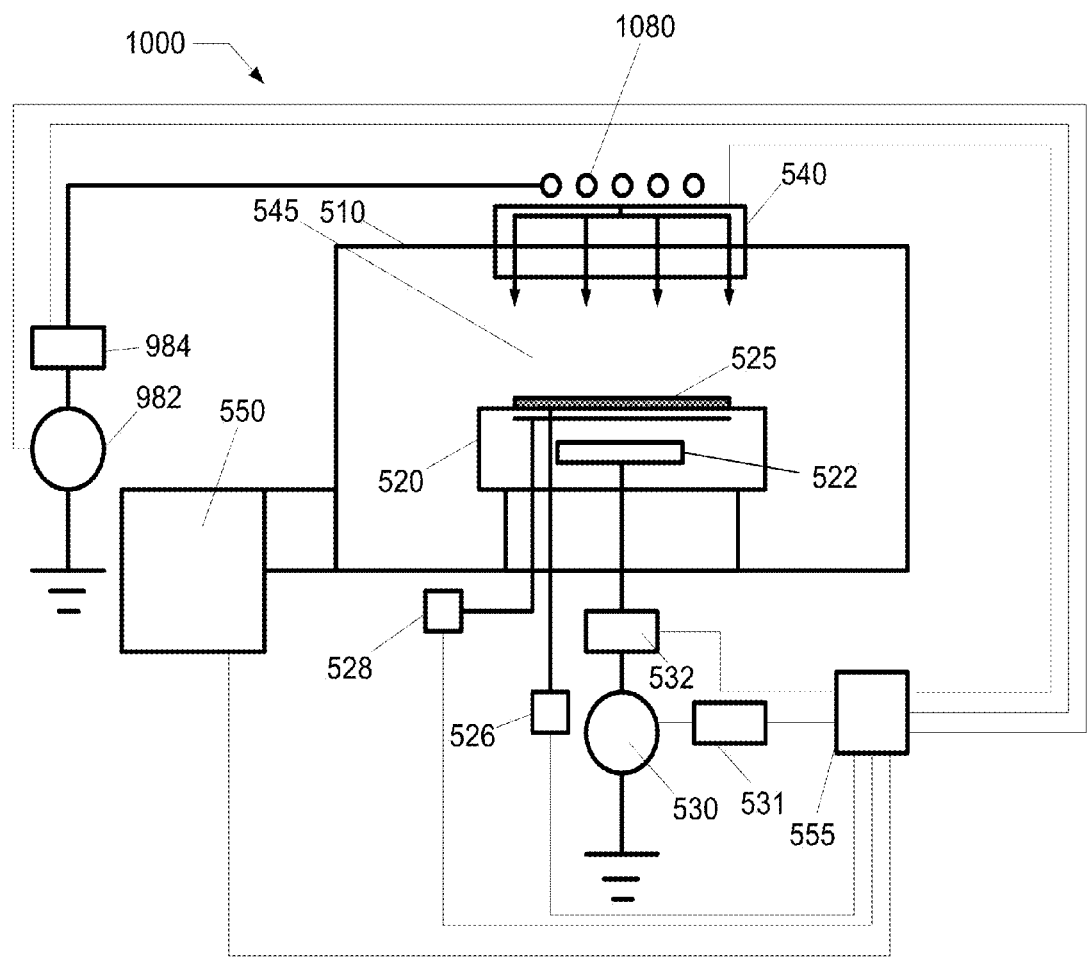
FIG. 10 shows a schematic representation of a plasma processing system according to another embodiment.

In an alternate embodiment, as shown in FIG. 10, plasma processing system 1000 can be similar to the embodiment of FIG. 9, and can further comprise an inductive coil 1080 that is a "spiral" coil or "pancake" coil in communication with the plasma processing region 545 from above as in a transformer coupled plasma (TCP) reactor. The design and implementation of an inductively coupled plasma (ICP) source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

In the embodiment shown in FIG. 11, plasma processing system 1100 can be similar to the embodiment of FIG. 5, and can further comprise a surface wave plasma (SWP) source 1130. The SWP source 1130 can comprise a slot antenna, such as a radial line slot antenna (RLSA), to which microwave power is coupled via a power coupling system 1190.

Figure 12:
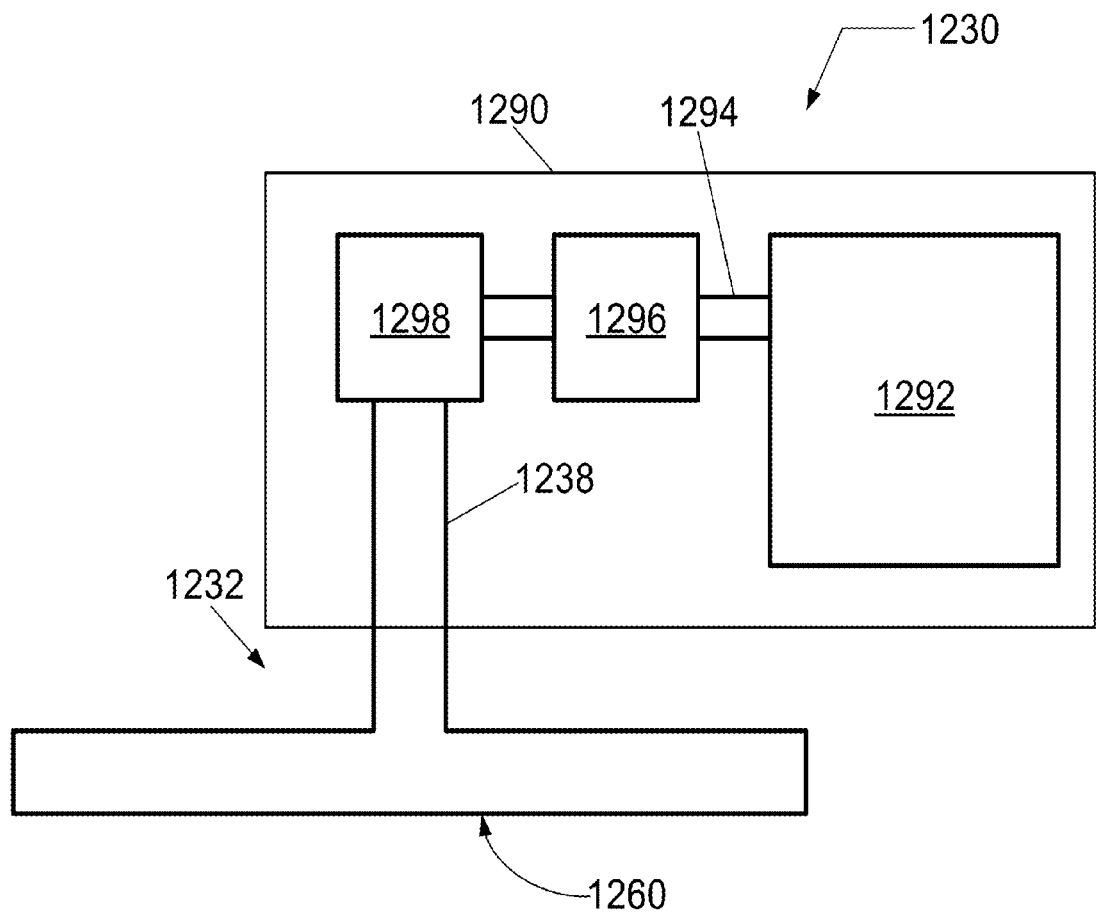
FIG. 12 depicts a cross-sectional view of a plasma source in accordance with one embodiment.

Referring now to FIG. 12, a schematic representation of a SWP source 1230 is provided according to an embodiment. The SWP source 1230 comprises an electromagnetic (EM) wave launcher 1232 configured to couple EM energy in a desired EM wave mode to a plasma by generating a surface wave on a plasma surface 1260 of the EM wave launcher 1232 adjacent plasma. Furthermore, the SWP source 1230 comprises a power coupling system 1290 coupled to the EM wave launcher 1232, and configured to provide the EM energy to the EM wave launcher 1232 for forming the plasma.

The EM wave launcher 1232 includes a microwave launcher configured to radiate microwave power into plasma processing region 545 (see FIG. 11). The EM wave launcher 1232 is coupled to the power coupling system 1290 via coaxial feed 1238 through which microwave energy is transferred. The power coupling system 1290 includes a microwave source 1292, such as a 2.45 GHz microwave power source. Microwave energy generated by the microwave source 1292 is guided through a waveguide 1294 to an isolator 1296 for absorbing microwave energy reflected back to the microwave source 1292. Thereafter, the microwave energy is converted to a coaxial TEM (transverse electromagnetic) mode via a coaxial converter 1298.

A tuner may be employed for impedance matching, and improved power transfer. The microwave energy is coupled to the EM wave launcher 1232 via the coaxial feed 1238, wherein another mode change occurs from the TEM mode in the coaxial feed 1238 to a TM (transverse magnetic) mode. Additional details regarding the design of the coaxial feed 1238 and the EM wave launcher 1232 can be found in U.S. Pat. No. 5,024,716, entitled "Plasma processing apparatus for etching, ashing, and film-formation"; the content of which is herein incorporated by reference in its entirety.

Figure 13A:
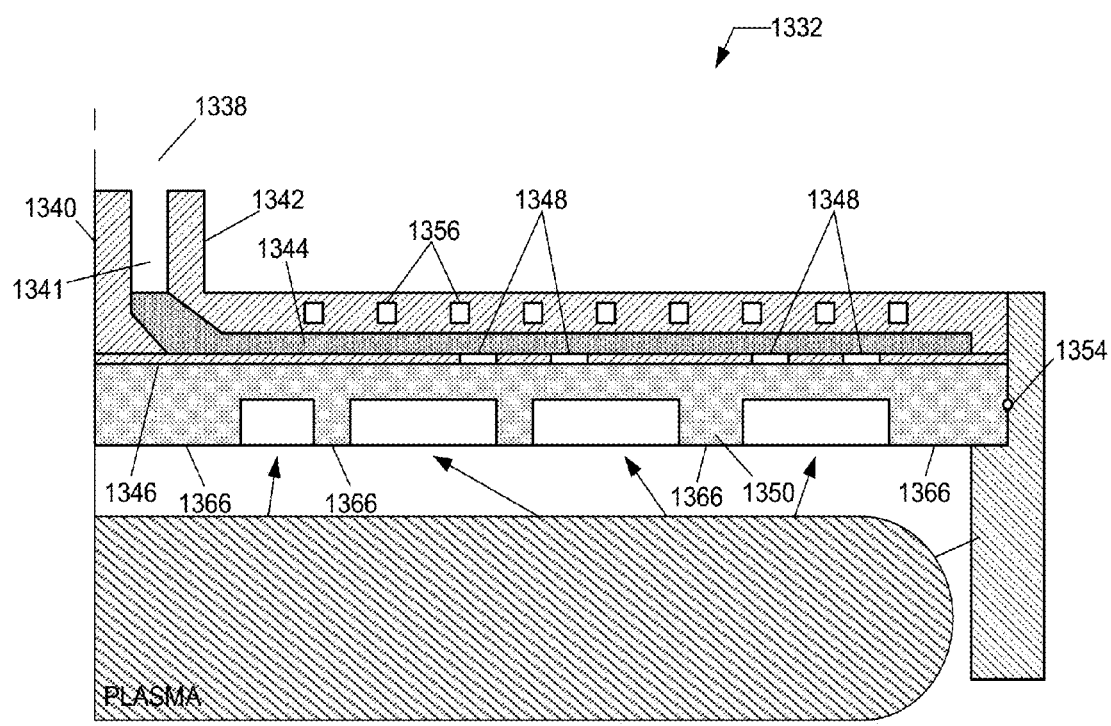
FIGS. 13A and 13B depict a cross-sectional view and bottom view of a plasma source in accordance with another embodiment.
Figure 13B:
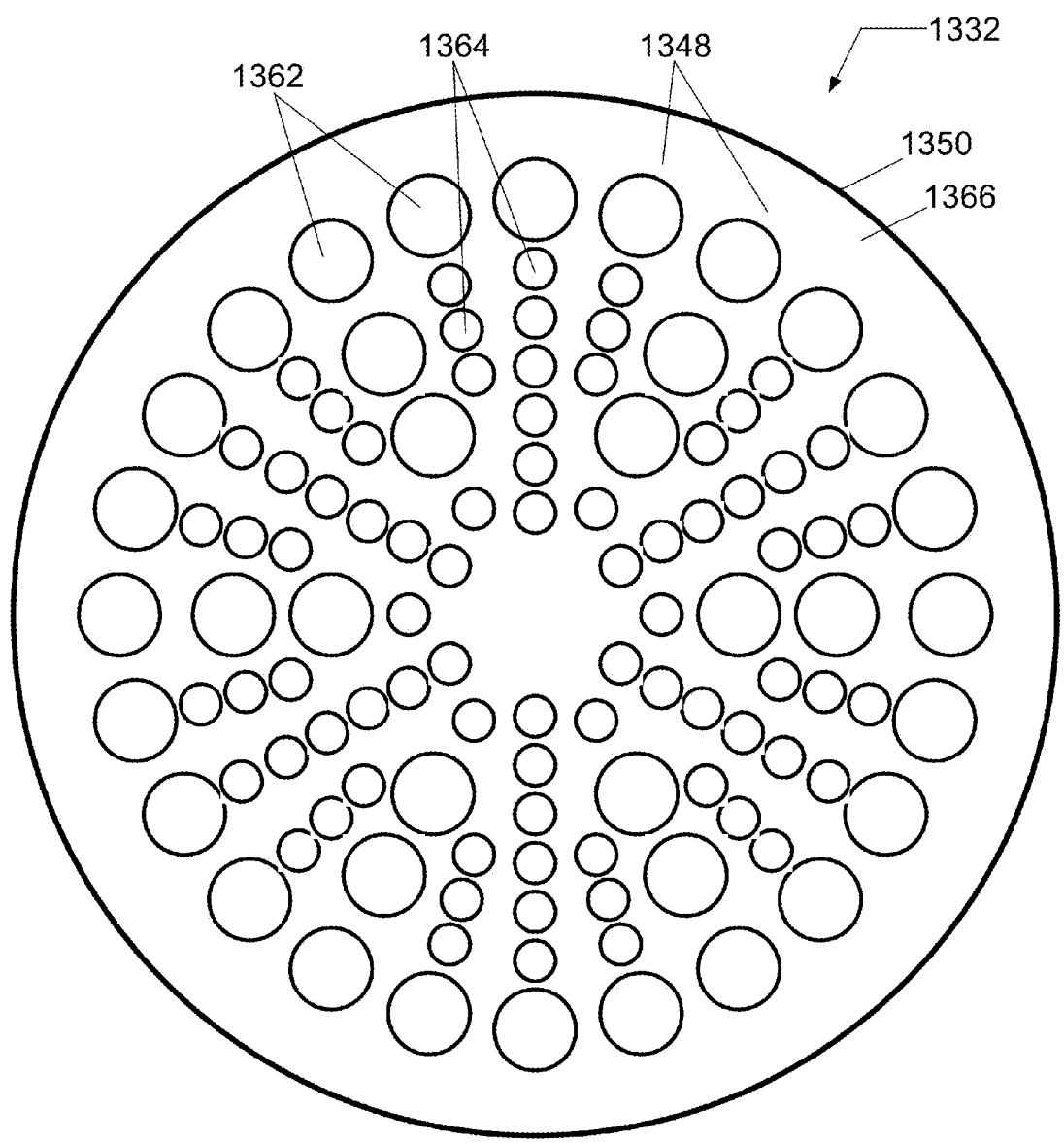

Referring now to FIGS. 13A and 13B, a schematic cross-sectional view and a bottom view, respectively, of an EM wave launcher 1332 are provided according to one embodiment. The EM wave launcher 1332 comprises a coaxial feed 1338 having an inner conductor 1340, an outer conductor 1342, and insulator 1341, such as an air gap, and a slot antenna 1346 having a plurality of slots 1348 coupled between the inner conductor 1340 and the outer conductor 1342 as shown in FIG. 13A. The plurality of slots 1348 permits the coupling of EM energy from a first region above the slot antenna 1346 to a second region below the slot antenna 1346, wherein plasma is formed adjacent a plasma surface 1360 on the EM wave launcher 1332. The EM wave launcher 1332 may further comprise a slow wave plate 1344, and a resonator plate 1350.

The number, geometry, size, and distribution of the slots 1348 are all factors that can contribute to the spatial uniformity of the plasma formed in the plasma processing region 545 (see FIG. 11). Thus, the design of the slot antenna 1346 may be used to control the spatial uniformity of the plasma in the plasma processing region 545 (see FIG. 11).

As shown in FIG. 13A, the EM wave launcher 1332 may comprise a fluid channel 1356 that is configured to flow a temperature control fluid for temperature control of the EM wave launcher 1332. Although not shown, the EM wave launcher 1332 may further be configured to introduce a process gas through the plasma surface 1360 to the plasma. Although not shown, a gas distribution system, such as the gas distribution system (540) of FIG. 11, may be connected to the EM wave launcher 1332 and/or the chamber wall 1352 for introducing a process gas into the process chamber.

Referring still to FIG. 13A, the EM wave launcher 1332 may be coupled to an upper chamber portion of a plasma processing system, wherein a vacuum seal can be formed between an upper chamber wall 1352 and the EM wave launcher 1332 using a sealing device 1354. The sealing device 1354 can include an elastomer O-ring; however, other known sealing mechanisms may be used.

In general, the inner conductor 1340 and the outer conductor 1342 of the coaxial feed 1338 comprise a conductive material, such as a metal, while the slow wave plate 1344 and the resonator plate 1350 comprise a dielectric material. In the latter, the slow wave plate 1344 and the resonator plate 1350 preferably comprise the same material; however, different materials may be used. The material selected for fabrication of the slow wave plate 1344 is chosen to reduce the wavelength of the propagating electromagnetic (EM) wave relative to the corresponding free-space wavelength, and the dimensions of the slow wave plate 1344 and the resonator plate 1350 are chosen to ensure the formation of a standing wave effective for radiating EM energy into the plasma processing region 545 (see FIG. 11).

The slow wave plate 1344 and the resonator plate 1350 can be fabricated from a dielectric material, including silicon-containing materials such as quartz (silicon dioxide), or a high dielectric constant (high-k) materials. For example, the high-k material may possess a dielectric constant greater than a value of 4. In particular, when the plasma processing system is utilized for etch process applications, quartz is often chosen for compatibility with the etch process.

For example, the high-k material can include intrinsic crystal silicon, alumina ceramic, aluminum nitride, and sapphire. However, other high-k materials may be used. Moreover, a particular high-k material may be selected in accordance with the parameters of a particular process. For example, when the resonator plate 1350 is fabricated from intrinsic crystal silicon, the plasma frequency exceeds 2.45 GHz at a temperature of 45 degrees C. Therefore, intrinsic crystal silicon is appropriate for low temperature processes (i.e., less than 45 degrees C.). For higher temperature processes, the resonator plate 1350 can be fabricated from alumina (Al.sub.2O.sub.3), or sapphire.

Plasma uniformity and plasma stability may remain as challenges for the practical implementation of a SWP source as described above. In the latter, the standing wave at the resonator plate-plasma interface, i.e., at the plasma surface 1360, may be prone to mode jumps as plasma parameters shift.

As shown in FIGS. 13A and 13B, the EM wave launcher 1332 may be fabricated with a first recess configuration 1362 formed in the plasma surface 1360 and optionally a second recess configuration 1364 formed in the plasma surface 1360 according to one embodiment.

The first recess configuration 1362 may comprise a first plurality of recesses. Each recess in the first recess configuration 1362 may comprise a unique indentation or dimple formed within the plasma surface 1360. For example, a recess in the first recess configuration 1362 may comprise a cylindrical geometry, a conical geometry, a frusto-conical geometry, a spherical geometry, an aspherical geometry, a rectangular geometry, a pyramidal geometry, or any arbitrary shape. The first recess distribution 1362 may comprise recesses characterized by a first size (e.g., latitudinal dimension (or width), and/or longitudinal dimension (or depth)).

The second recess configuration 1364 may comprise a plurality of recesses. Each recess in the second recess configuration 1364 may comprise a unique indentation or dimple formed within the plasma surface 1360. For example, a recess in the second recess configuration 1364 may comprise a cylindrical geometry, a conical geometry, a frusto-conical geometry, a spherical geometry, an aspherical geometry, a rectangular geometry, a pyramidal geometry, or any arbitrary shape. The second recess distribution 1364 may comprise recesses characterized by a second size (e.g., latitudinal dimension (or width), and/or longitudinal dimension (or depth)). The first size of the recesses in the first recess configuration 1362 may or may not be the same as the second size of the recesses in the second recess configuration 1364. For instance, the second size may be smaller than the first size.

As shown in FIGS. 13A and 13B, the resonator plate 1350 comprises a dielectric plate having a plate diameter and a plate thickness. Therein, the plasma surface 1360 on resonator plate 1350 comprises a planar surface 1366 within which the first recess configuration 1362 and the second recess configuration 1364 are formed. Alternatively, the resonator plate 1350 comprises a non-planar geometry or an arbitrary geometry. Therein, the plasma surface 1360 may comprise a non-planar surface within which the first recess configuration and the second recess configuration are formed (not shown). For example, the non-planar surface may be concave, or convex, or a combination thereof.

The propagation of EM energy in the resonator plate 1350 may be characterized by an effective wavelength (.lamda.) for a given frequency of EM energy and dielectric constant for the resonator plate 1350. The plate thickness may be an integer number of quarter wavelengths (n.lamda./4, where n is an integer greater than zero) or an integer number of half wavelengths (m.lamda./2, where m is an integer greater than zero). For instance, the plate thickness may be about half the effective wavelength (.lamda./2) or greater than half the effective wavelength (>.lamda./2). Alternatively, the plate thickness may be a non-integral fraction of the effective wavelength (i.e., not an integral number of half or quarter wavelengths). Alternatively yet, the plate thickness may range from about 25 mm (millimeters) to about 45 mm.

As an example, the first recess configuration 1362 may comprise a first plurality of cylindrical recesses, wherein each of the first plurality of cylindrical recesses is characterized by a first depth and a first diameter. As shown in FIG. 13B, the first recess configuration 1362 is located near an outer region of the plasma surface 1360

The first diameter may be an integer number of quarter wavelengths (n.lamda./4, where n is an integer greater than zero), or an integer number of half wavelengths (m.lamda./2, where m is an integer greater than zero), or a non-integral fraction of the effective wavelength. Additionally, a first difference between the plate thickness and the first depth may be an integer number of quarter wavelengths (n.lamda./4, where n is an integer greater than zero), or an integer number of half wavelengths (m.lamda./2, where m is an integer greater than zero), or a non-integral fraction of the effective wavelength. For instance, the first diameter may be about half the effective wavelength (.lamda./2), and the first difference between the plate thickness and the first depth may be about half the effective wavelength (.lamda./2) or about quarter the effective wavelength (.lamda./4). Additionally, for instance, the plate thickness may be about half the effective wavelength (.lamda./2) or greater than half the effective wavelength (>.lamda./2).

Alternatively, the first diameter may range from about 25 mm to about 35 mm, and the first difference between the plate thickness and the first depth may range from about 10 mm to about 35 mm. Alternatively yet, the first diameter may range from about 30 mm to about 35 mm, and the first difference may range from about 10 mm to about 20 mm. Alternatively yet, the first diameter and/or first depth may be a fraction of the plate thickness.

In the first recess configuration 1362, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma surface 1360. For example, the surface radius may range from about 1 mm to about 3 mm.

As another example, the second recess configuration 1364 may comprise a second plurality of cylindrical recesses, each of the second plurality of cylindrical recesses being characterized by a second depth and a second diameter. As shown in FIG. 13B, the second recess configuration 1364 is located near an inner region of the plasma surface 1360.

The second diameter may be an integer number of quarter wavelengths (n.lamda./4, where n is an integer greater than zero), or an integer number of half wavelengths (m.lamda./2, where m is an integer greater than zero), or a non-integral fraction of the effective wavelength. Additionally, a second difference between the plate thickness and the second depth may be an integer number of quarter wavelengths (n.lamda./4, where n is an integer greater than zero), or an integer number of half wavelengths (m.lamda./2, where m is an integer greater than zero), or a non-integral fraction of the effective wavelength. For instance, the second diameter may be about half the effective wavelength (.lamda./2), and the second difference between the plate thickness and the second depth may be about half the effective wavelength (.lamda./2) or about quarter the effective wavelength (.lamda./4). Additionally, for instance, the plate thickness may be about half the effective wavelength (.lamda./2) or greater than half the effective wavelength (>.lamda./2).

Alternatively, the second diameter may range from about 25 mm to about 35 mm, and the second difference between the plate thickness and the second depth may range from about 10 mm to about 35 mm. Alternatively yet, the second diameter may range from about 30 mm to about 35 mm, and the second difference may range from about 10 mm to about 20 mm. Alternatively yet, the second diameter and/or second depth may be a fraction of the plate thickness.

In the second recess configuration 1364, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma surface 1360. For example, the surface radius may range from about 1 mm to about 3 mm.

Referring again to FIG. 13B, a bottom view of the EM wave launcher 1332 depicted in FIG. 13A is provided. The plurality of slots 1348 in slot antenna 1346 are illustrated as if one can see through resonator plate 1350 to the slot antenna 1346. As shown in FIG. 13B, the plurality of slots 1348 may be arranged in pairs, wherein each of the pair of slots comprises a first slot oriented orthogonal to a second slot. However, the orientation of slots in the plurality of slots 1348 may be arbitrary. For example, the orientation of slots in the plurality of slots 1348 may be according to a pre-determined pattern for plasma uniformity and/or plasma stability.

The first recess configuration 1362 is substantially aligned with a first arrangement of slots in the plurality of slots 1348. Therein, at least one recess of the first recess configuration 1362 may be aligned, partially aligned, or not aligned with one or more of the plurality of slots 1348. The second recess configuration 1364 is either partly aligned with a second arrangement of slots in the plurality of slots 1348 or not aligned with the second arrangement of slots in the plurality of slots 1348. As shown in FIG. 13B, the second recess configuration 1364 is not aligned with the second arrangement of slots in the plurality of slots 1348.

As a consequence, the arrangement of the first and second recess configurations 1362, 1364 and their alignment with one or more of the plurality of slots 1348 may be optimized to control and/or improve plasma uniformity and/or stability. Additional details regarding the design of the plasma surface 1360 and the EM wave launcher 1332 can be found in pending U.S. Patent Application Publication Serial No. 2011/0057562, entitled "Stable surface wave plasma source", and filed on Sep. 8, 2009; the content of which is herein incorporated by reference in its entirety.

Figure 14:
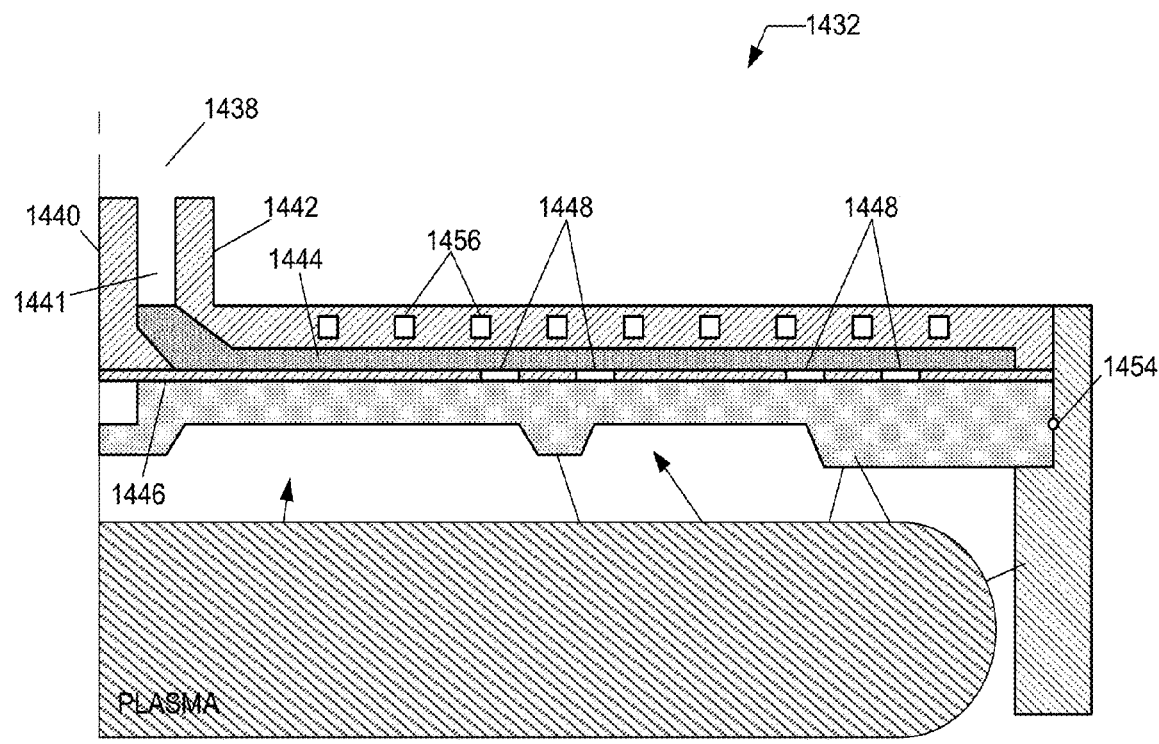
FIG. 14 depicts a cross-sectional view of a plasma source in accordance with another embodiment.

Referring now to FIG. 14, a schematic cross-sectional view of an EM wave launcher 1432 is provided according to another embodiment. The EM wave launcher 1432 comprises the coaxial feed 1438 having an inner conductor 1440, an outer conductor 1442, and insulator 1441, such as an air gap, and a slot antenna 1446 having a plurality of slots 1448 coupled between the inner conductor 1440 and the outer conductor 1442 as shown in FIG. 14. The plurality of slots 1448 permits the coupling of EM energy from a first region above the slot antenna 1446 to a second region below the slot antenna 1446, wherein plasma is formed adjacent a plasma surface 1460 on the EM wave launcher 1432. The EM wave launcher 1432 may further comprise a slow wave plate 1444, and a resonator plate 1450.

The number, geometry, size, and distribution of the slots 1448 are all factors that can contribute to the spatial uniformity of the plasma formed in the plasma processing region 545 (see FIG. 11). Thus, the design of the slot antenna 1446 may be used to control the spatial uniformity of the plasma in the plasma processing region 545 (see FIG. 11).

As shown in FIG. 14, the EM wave launcher 1432 may comprise a fluid channel 1456 that is configured to flow a temperature control fluid for temperature control of the EM wave launcher 1432. Although not shown, a gas distribution system, such as the gas distribution system (540) of FIG. 11, may be connected to the EM wave launcher 1432 and/or the chamber wall 1452 for introducing a process gas into the process chamber.

Referring still to FIG. 14, the EM wave launcher 1432 may be coupled to an upper chamber portion of a plasma processing system, wherein a vacuum seal can be formed between an upper chamber wall 1452 and the EM wave launcher 1432 using a sealing device 1454. The sealing device 1454 can include an elastomer O-ring; however, other known sealing mechanisms may be used.

In general, the inner conductor 1440 and the outer conductor 1442 of the coaxial feed 1438 comprise a conductive material, such as a metal, while the slow wave plate 1444 and the resonator plate 1450 comprise a dielectric material. In the latter, the slow wave plate 1444 and the resonator plate 1450 preferably comprise the same material; however, different materials may be used. The material selected for fabrication of the slow wave plate 1444 is chosen to reduce the wavelength of the propagating electromagnetic (EM) wave relative to the corresponding free-space wavelength, and the dimensions of the slow wave plate 1444 and the resonator plate 1450 are chosen to ensure the formation of a standing wave effective for radiating EM energy into the plasma processing region 545 (see FIG. 11).

The slow wave plate 1444 and the resonator plate 1450 can be fabricated from a dielectric material, including silicon-containing materials such as quartz (silicon dioxide), or a high dielectric constant (high-k) materials. For example, the high-k material may possess a dielectric constant greater than a value of 4. In particular, when the plasma processing system is utilized for etch process applications, quartz is often chosen for compatibility with the etch process.

For example, the high-k material can include intrinsic crystal silicon, alumina ceramic, aluminum nitride, and sapphire. However, other high-k materials may be used. Moreover, a particular high-k material may be selected in accordance with the parameters of a particular process. For example, when the resonator plate 1450 is fabricated from intrinsic crystal silicon, the plasma frequency exceeds 2.45 GHz at a temperature of 45 degrees C. Therefore, intrinsic crystal silicon is appropriate for low temperature processes (i.e., less than 45 degrees C.). For higher temperature processes, the resonator plate 1450 can be fabricated from alumina ($Al_2O_3$), or sapphire.

Plasma uniformity and plasma stability may remain as challenges for the practical implementation of a SWP source as described above. In the latter, the standing wave at the resonator plate-plasma interface, i.e., at the plasma surface 1460, may be prone to mode jumps as plasma parameters shift.

As shown in FIG. 14, the EM wave launcher 1432 may be fabricated with a first recess configuration 1462 formed in the plasma surface 1460 and optionally a second recess configuration 1464 formed in the plasma surface 1460 according to one embodiment.

The first recess configuration 1462 may comprise a first channel recess. For example, the first channel recess in the first recess configuration 1462 may include a cross-section that has a frusto-conical geometry. However, other geometries may be used, e.g., a spherical geometry, an aspherical geometry, a rectangular geometry, a pyramidal geometry, or any arbitrary shape. The first recess distribution 1462 may comprise a channel recess characterized by a first size (e.g., latitudinal dimension (or width), and/or longitudinal dimension (or depth)).

The second recess configuration 1464 may comprise a second channel recess. For example, the second channel recess in the second recess configuration 1464 may include a cross-section that has a frusto-conical geometry. However, other geometries may be used, e.g., a spherical geometry, an aspherical geometry, a rectangular geometry, a pyramidal geometry, or any arbitrary shape. The second recess distribution 1464 may comprise a channel recess characterized by a second size (e.g., latitudinal dimension (or width), and/or longitudinal dimension (or depth)). The first size of the first channel recess in the first recess configuration 1462 may or may not be the same as the second size of the second channel recess in the second recess configuration 1464. For instance, the second size may be larger than the first size.

As shown in FIG. 14, the resonator plate 1450 comprises a dielectric plate having a plate diameter and a plate thickness. Therein, the plasma surface 1460 on resonator plate 1450 comprises a planar surface 1466 within which the first recess configuration 1462 and the second recess configuration 1464 are formed. Alternatively, the resonator plate 1450 comprises a non-planar geometry or an arbitrary geometry. Therein, the plasma surface 1460 may comprise a non-planar surface within which the first recess configuration and the second recess configuration are formed (not shown). For example, the non-planar surface may be concave, or convex, or a combination thereof.

The arrangement of the first and second recess configurations (1462, 1464) and their alignment with one or more of the plurality of slots 1448 may be optimized to control and/or improve plasma uniformity and/or stability. Additional details regarding the design of the plasma surface 1460 and the EM wave launcher 1432 can be found in pending U.S. patent application Ser. No. 10/570,631, entitled "Plasma processing equipment", filed on Dec. 19, 2006, and published as U.S. Patent Application Publication No. 2007/0113788A1; the content of which is herein incorporated by reference in its entirety.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for performing a spacer etch process utilizing a post deposition treatment, the method comprising:
   conformally applying a spacer material over a gate structure on a substrate, the spacer material having an initial K-value;
   treating an exposed surface of said spacer material to an oxygen-containing plasma environment to form a spacer oxidation layer; and
   performing one or more spacer etch process sequences to partially remove said spacer oxidation layer and spacer material from said gate structure and said substrate, while retaining a sidewall spacer positioned along a sidewall of said gate structure resulting in a bi-layer spacer with the spacer oxidation layer on the outer side of the spacer yielding a spacer with a final K-value; and
   controlling spacer etch variables in order to achieve a target difference of initial K-value to final K-value of the spacer;
   wherein the spacer material comprises silicon nitride ($Si_xN_z$), silicon carbide ($Si_xC_y$), or silicon carbonitride ($Si_xC_yN_z$); or silicon oxycarbonnitride ($Si_xOC_yN_z$) and wherein the difference between the initial K-value and the final K-value is 5 to 10% of the initial K-value; and
   wherein the spacer material conformally applied over the gate structure has a thickness less than or equal to 10 nanometers (nm), the oxygen-containing environment contains an oxygen-containing plasma, the oxygen-containing plasma comprises O, $O_2$, $O_3$, CO, $CO_2$, NO, $N_2O$, or $NO_2$, or any combination of two or more thereof, and the oxygen containing plasma has a flow rate of 300 to 400 sccm.

2. The method of claim 1, wherein said performing one or more spacer etch process sequences comprises:
   introducing an etching process composition containing any fluorocarbon gas CxHyFz combined with an oxidant such as O2 or CO2 or a reductant such as H2 and diluent such as Ar or He to a plasma processing system;
   setting a pressure in said plasma processing system in a range of 5 to 20 mTorr;
   setting a temperature for said plasma processing system in a range of 20 to 100° C.;
   forming a first etching plasma from said etching process composition; and
   exposing said substrate to said etching plasma for a time period of 60 to 120 seconds.

3. The method of claim 2, wherein said performing one or more etching processes further comprises:
   forming said etching plasma by coupling electromagnetic (EM) radiation from a radial line slot antenna (RLSA) to said etching process composition; and
   applying an electrical bias to said substrate by coupling radio frequency (RF) power to a substrate holder upon which said substrate rests;
   wherein said electrical bias is in the range of 0 to −25 W.

4. The method of claim 3, wherein said forming said etching plasma comprises coupling electromagnetic (EM) energy at a microwave frequency in a desired EM wave mode to said etching plasma by generating a surface wave on a plasma surface of an EM wave launcher adjacent said etching plasma, said EM wave launcher comprises a slot antenna having a plurality of slots formed there through configured to couple said EM energy from a first region above said slot antenna to a second region below said slot antenna; and/or wherein said spacer material comprises SiON, SiOCN, and/or SiBCN.

5. A method for performing a spacer etch process utilizing a post spacer treatment, the method comprising:
   conformally applying a spacer material over a gate structure on a substrate, the spacer material having an initial K-value;
   performing one or more spacer etch process sequences to partially remove said spacer material from said gate structure and said substrate, while retaining a sidewall spacer positioned along a sidewall of said gate structure; and
   treating an exposed surface of said spacer material and substrate to an oxygen containing environment to form a spacer oxidation layer yielding a spacer with a final K-value;
   controlling spacer etch variables in order to achieve a target difference of initial K-value to final K-value of the spacer;
   wherein the spacer material comprises silicon nitride (SixNz), silicon carbide ($Si_xC_y$), or silicon carbonitride ($Si_xC_yN_z$) or silicon oxycarbonnitride ($Si_xOC_yN_z$); and
   wherein the difference between the initial K-value and the final K-value is 5 to 10% of the initial K-value; and
   wherein the spacer material conformally applied over the gate structure has a thickness less than or equal to 10 nanometers (nm), the oxygen-containing environment contains an oxygen-containing plasma, the oxygen-containing plasma comprises O, $O_2$, $O_3$, CO, $CO_2$, NO, $N_2O$, or $NO_2$, or any combination of two or more thereof, and the oxygen containing plasma has a flow rate of 300 to 400 sccm.

6. The method of claim 5, wherein said performing one or more spacer etch process sequences comprises:
   introducing an etching process composition containing any fluorocarbon gas CxHyFz combined with an oxidant such as O2 or CO2 or a reductant such as H2 and diluent such as Ar or He to a plasma processing system;
   setting a pressure in said plasma processing system at or less than about 5 to 20 mTorr;
   setting a temperature for said plasma processing system at a range of 20 to 100° C.;
   forming a first etching plasma from said etching process composition; and
   exposing said substrate to said etching plasma for a time period of 60 to 120 seconds.

7. The method of claim 6, wherein said performing one or more etching processes further comprises:
   forming said etching plasma by coupling electromagnetic (EM) radiation from a radial line slot antenna (RLSA) to said etching process composition; and
   applying an electrical bias to said substrate by coupling radio frequency (RF) power to a substrate holder upon which said substrate rests;
   wherein said electrical bias is in the range of 0 to −25 W.

8. A method for performing a spacer etch process utilizing a post partial contact etch and oxidation treatment, comprising:
   conformally applying a spacer material over a gate structure on a substrate, the spacer material having an initial K-value;

performing one or more spacer etch process sequences to partially remove said spacer material from said gate structure and said substrate, while retaining a sidewall spacer positioned along a sidewall of said gate structure; and performing one or more deposition process sequences to generate an oxide fill layer above the gate structure;

performing a partial-contact etch sequence to remove the oxide fill layer above a portion of the gate structure;

treating an exposed surface of said portion of the gate structure to an oxygen-containing environment to form a spacer oxidation layer;

performing a finish-contact etch sequence to remove remaining oxide fill layer above said portion of the gate structure, yielding a spacer with a final K-value; and controlling spacer etch variables in order to achieve a target difference of initial K-value to final K-value of the spacer;

wherein the spacer material comprises silicon nitride ($Si_xN_z$), silicon carbide ($Si_xC_y$), or silicon carbonitride ($Si_xC_yN_z$) or silicon oxycarbonnitride ($Si_xOC_yN_z$); and wherein the difference between the initial K-value and the final K-value is 5 to 10% of the initial K-value; and/or wherein the spacer material conformally applied over the gate structure has a thickness less than or equal to 10 nanometers (nm), the oxygen-containing environment contains an oxygen-containing plasma, the oxygen-containing plasma comprises O, $O_2$, $O_3$, CO, $CO_2$, NO, $N_2O$, or $NO_2$, or any combination of two or more thereof, the oxygen containing plasma has a flow rate of 300 to 400 sccm; and wherein said performing one or more spacer etch process sequences comprises:

introducing an etching process composition containing any fluorocarbon gas CxHyFz combined with an an oxidant such as O2 or CO2 or a reductant such as H2 and diluent such as Ar or He setting a pressure in said plasma processing system at or less than about 5 to 20 mTorr;

setting a temperature for said plasma processing system at a range of 20 to 100° C.;

forming a first etching plasma from said etching process composition; and exposing said substrate to said etching plasma for a time period of 60 to 120 seconds; or wherein said performing one or more etching processes further comprises:

forming said etching plasma by coupling electromagnetic (EM) radiation from a radial line slot antenna (RLSA) to said etching process composition; and applying an electrical bias to said substrate by coupling radio frequency (RF) power to a substrate holder upon which said substrate rests;

wherein said electrical bias is in the range of 0 to −25 W.

9. The method of claim 8, wherein the target difference between the initial K-value and the final K-value is 2 to 16% of the initial K-value.

10. A method for performing a spacer etch process utilizing a post deposition and nitridation treatment, the method comprising:

conformally applying a spacer material over a gate structure on a substrate;

treating an exposed surface of said spacer material to an nitrogen-containing environment to form a spacer nitridation layer; and performing one or more spacer etch process sequences to partially remove said spacer nitridation layer and spacer material from said gate structure and said substrate, while retaining a sidewall spacer positioned along a sidewall of said gate structure resulting in a bi-layer spacer with the spacer nitridation layer on the outside of the spacer; and controlling spacer etch variables in order to achieve target wet resistance to wet etch treatment liquids;

wherein the spacer material comprises SiON, SiOCN, or SiBCN.

11. The method of claim 10, wherein the spacer material conformally applied over the gate structure has a thickness less than or equal to 10 nanometers (nm), the nitrogen-containing plasma has a flow rate of 300 to 400 sccm.

12. The method of claim 11, wherein said performing one or more spacer etch process sequences comprises:

introducing an etching process composition containing any fluorocarbon gas CxHyFz combined with an oxidant such as O2 or CO2 or a reductant such as H2 and diluent such as Ar or He to a plasma processing system;

setting a pressure in said plasma processing system at or less than about 5 to 20 mTorr;

setting a temperature for said plasma processing system at a range of 20 to 100° C.;

forming an etching plasma from said etching process composition; and exposing said substrate to said etching plasma for a time period of 60 to 120 seconds.

13. The method of claim 12, wherein said performing one or more etching processes further comprises:

forming said etching plasma by coupling electromagnetic (EM) radiation from a radial line slot antenna (RLSA) to said etching process composition; and applying an electrical bias to said substrate by coupling radio frequency (RF) power to a substrate holder upon which said substrate rests;

wherein said electrical bias is in the range of 0 to −25 W.

14. A method for performing a spacer etch process utilizing a post spacer reaction-in etch (RIE) and nitridation treatment, the method comprising:

conformally applying a spacer material over a gate structure on a substrate;

performing one or more plasma spacer etch process sequence to partially remove said spacer material from said gate structure and said substrate, while retaining a sidewall spacer positioned along a sidewall of said gate structure; and treating an exposed surface of said gate structure to an nitrogen-containing environment to form a spacer nitridation layer; and controlling spacer etch variables in order to achieve a target wet resistance increase of the spacer to wet etch treatment liquid;

wherein the spacer material comprises SiON, SiOCN, or SiBCN.

15. The method of claim 14:

wherein the spacer material conformally applied over the gate structure has a thickness less than or equal to 10 nanometers (nm), the nitrogen-containing plasma has a flow rate of 300 to 400 sccm;

wherein the nitrogen containing environment comprises ammonia, nitrogen, and/or hydrazine; and/or wherein the target wet resistance increase of the spacer to wet etch treatment liquids is 0.25 of the normalized etch rate of thermal oxide.

16. The method of claim 15, wherein said performing one or more spacer etch process sequences comprises:

introducing an etching process composition containing any fluorocarbon gas CxHyFz combined with an oxidant such as O2 or CO2 or a reductant such as H2 and diluent such as Ar or He to a plasma processing system;

setting a pressure in said plasma processing system at or less than about 5 to 20 mTorr;

setting a temperature for said plasma processing system at a range of 20 to 100° C.;

forming an etching plasma from said etching process composition; and exposing said substrate to said etching plasma for a time period of 60-120 seconds.

17. The method of claim 15, wherein said performing one or more etching processes further comprises:

forming said etching plasma by coupling electromagnetic (EM) radiation from a radial line slot antenna (RLSA) to said etching process composition; and applying an electrical bias to said substrate by coupling radio frequency (RF) power to a substrate holder upon which said substrate rests, wherein said electrical bias is in the range of 0 to −25 W.

* * * * *